US010425623B2

(12) United States Patent
Ishii

(10) Patent No.: US 10,425,623 B2
(45) Date of Patent: Sep. 24, 2019

(54) DISPLAY PANEL CONTROL DEVICE, DISPLAY DEVICE AND METHOD FOR DRIVING DISPLAY PANEL

(71) Applicant: JOLED INC., Tokyo (JP)

(72) Inventor: Hiroaki Ishii, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 15/991,267

(22) Filed: May 29, 2018

(65) Prior Publication Data

US 2018/0359453 A1 Dec. 13, 2018

(30) Foreign Application Priority Data

Jun. 12, 2017 (JP) ................................ 2017-115078

(51) Int. Cl.
| | |
|---|---|
| *H04N 5/04* | (2006.01) |
| *G09G 3/3258* | (2016.01) |
| *G09G 3/3233* | (2016.01) |
| *H04N 7/56* | (2006.01) |
| *H01L 27/32* | (2006.01) |

(52) U.S. Cl.
CPC ............ *H04N 7/56* (2013.01); *G09G 3/3233* (2013.01); *G09G 3/3258* (2013.01); *H04N 5/04* (2013.01); *G09G 2300/0842* (2013.01); *G09G 2300/0861* (2013.01); *G09G 2310/0251* (2013.01); *G09G 2310/0264* (2013.01); *G09G 2320/0626* (2013.01); *G09G 2360/16* (2013.01); *H01L 27/3276* (2013.01)

(58) Field of Classification Search
CPC ....... G09G 2360/16; G09G 2320/0653; H04N 5/04
See application file for complete search history.

(56) References Cited

U.S. PATENT DOCUMENTS

| | | | | |
|---|---|---|---|---|
| 2005/0275728 A1* | 12/2005 | Mirtich | .................. | G03B 7/087 348/211.99 |
| 2009/0303227 A1* | 12/2009 | Hwang | ................ | G09G 3/2055 345/214 |
| 2010/0008684 A1* | 1/2010 | Matsumoto | ........ | G03G 15/0822 399/45 |

(Continued)

FOREIGN PATENT DOCUMENTS

JP 2006-030516 2/2006

*Primary Examiner* — Paulos M Natnael
(74) *Attorney, Agent, or Firm* — Greenblum & Bernstein, P.L.C.

(57) ABSTRACT

A control device includes a data storing unit, a synchronization control unit, a light emission control unit, and a luminance adjustment unit. The light emission control unit derives a luminance adjustment parameter for adjusting a light emission luminance of light emitting elements when a video image is displayed with a total number of vertical lines in a current frame such that a total light emission amount of the light emitting elements during one frame period when the video image is displayed with the total number of vertical lines in the current frame is equal to a total light emission amount of the light emitting elements during one frame period when a video image is displayed with a pre-set minimum number of vertical lines. The luminance adjustment unit adjusts, based on the luminance adjustment parameter, the light emission luminance of the light emitting elements.

15 Claims, 10 Drawing Sheets

(56) References Cited

U.S. PATENT DOCUMENTS

| | | | |
|---|---|---|---|
| 2015/0054815 A1* | 2/2015 | Toyoda | G09G 3/3233 |
| | | | 345/212 |
| 2015/0124124 A1* | 5/2015 | Maeyama | H04N 5/2355 |
| | | | 348/235 |
| 2016/0107564 A1* | 4/2016 | Sola Gomfaus | B60Q 1/2607 |
| | | | 315/79 |
| 2018/0350304 A1* | 12/2018 | Ishii | G09G 3/3258 |
| 2018/0359453 A1* | 12/2018 | Ishii | H04N 7/56 |
| 2019/0014292 A1* | 1/2019 | Ishii | H04N 7/56 |
| 2019/0051234 A1* | 2/2019 | Ishii | G09G 3/3208 |

* cited by examiner

FIG. 9

| $V_{min}$ | $V_{now}$ | $V_{diff}$ | Luminance adjustment parameter |
|---|---|---|---|
| 100 | 100 | 0 | 1.000 |
| 100 | 110 | 10 | 0.909 |
| 100 | 120 | 20 | 0.833 |
| ⋮ | ⋮ | ⋮ | ⋮ |
| 100 | 200 | 0 | 0.500 |
| ⋮ | ⋮ | ⋮ | ⋮ |
| 150 | 150 | 0 | 1.000 |
| 150 | 160 | 10 | 0.9375 |
| ⋮ | ⋮ | ⋮ | ⋮ |
| 200 | 200 | 0 | 1.000 |
| 200 | 210 | 10 | 0.952 |
| ⋮ | ⋮ | ⋮ | ⋮ |

70

DISPLAY PANEL CONTROL DEVICE, DISPLAY DEVICE AND METHOD FOR DRIVING DISPLAY PANEL

CROSS REFERENCE TO RELATED APPLICATIONS

The present application is based on and claims priority of Japanese Patent Application No. 2017-115078 filed on Jun. 12, 2017. The entire disclosure of the above-identified application, including the specification, drawings and claims is incorporated herein by reference in its entirety.

FIELD

The present disclosure relates to a display panel control device, a display device, and a method for driving a display panel.

BACKGROUND

Conventionally, in a computer or a mobile device, a video image is displayed on a display screen by a video image processing device called GPU (Graphics Processing Unit) (see, for example, Patent Literature 1 (PTL 1)).

PTL 1 discloses a display device in which the number of sub-frames that constitute one frame is determined according to a set on-duty ratio. Then, display driving is performed based on the determined number of sub-frames.

Also, in recent years, the video image display rate on a display screen is determined increasingly by the GPU performance.

CITATION LIST

Patent Literature

PTL 1: Japanese Unexamined Patent Application Publication No. 2006-30516

SUMMARY

Technical Problem

In a display device according to conventional technology, the duration (frame period) during which one screen's worth of data is displayed is set to be constant, and thus an on-duty ratio, which is the ratio of a light emission period to a frame period, is determined based on an estimated number of vertical lines. Then, the display device is controlled by a video image signal and a synchronization signal such that light emission is performed based on the on-duty ratio and a display is provided at pre-set light emission and light extinction timings.

However, because the frame period is variable depending on the content processed by the GPU, the frame period may vary significantly depending on the GPU's processing power, or the like. The on-duty ratio, which is the ratio of a light emission period to a frame period, varies as well according to the variation of the frame period. This causes a problem in that the pre-set light emission timing does not match the actual display timing, causing a flicker phenomenon in which fine flickering appears on the screen.

In view of the problem described above, it is an object of the present disclosure to provide a display panel control device, a display device, and a method for driving a display panel, with which it is possible to suppress a flicker phenomenon.

Solution to Problem

In order to achieve the object described above, a display panel control device according to one aspect of the present disclosure is a control device that controls display of a display panel in which a plurality of pixel circuits that include light emitting elements are arranged in rows and columns, the control device including: a data storing unit that temporarily stores a video image signal received from outside; a synchronization control unit that supplies the video image signal from the data storing unit to the display panel based on a vertical synchronization signal received from the outside or a start timing of the video image signal; a light emission control unit that controls a light emission luminance and a light emission timing of the light emitting elements; and a luminance adjustment unit that adjusts the light emission luminance of the light emitting elements when the video image signal read out from the data storing unit is displayed. The light emission control unit derives a luminance adjustment parameter for adjusting the light emission luminance of the light emitting elements when a video image is displayed with a total number of vertical lines in a current frame such that a total light emission amount of the light emitting elements during one frame period when the video image is displayed with the total number of vertical lines in the current frame is equal to a total light emission amount of the light emitting elements during one frame period when a video image is displayed with a pre-set minimum number of vertical lines. The luminance adjustment unit adjusts, based on the luminance adjustment parameter, the light emission luminance of the light emitting elements when the video image is displayed with the total number of vertical lines in the current frame.

With this configuration, the luminance adjustment parameter is derived such that the total light emission amount during one frame period when a video image is displayed with the total number of vertical lines in the current frame is equal to the total light emission amount during one frame period when a video image is displayed with the minimum number of vertical lines. Accordingly, by performing light emission luminance adjustment by using the luminance adjustment parameter, the total light emission amount during one frame period when a video image is displayed with the total number of vertical lines in the current frame can be made equal to the total light emission amount during one frame period when a video image is displayed with the minimum number of vertical lines. As a result, the control device can suppress a flicker phenomenon that occurs in the display panel even if the frame period varies due to the GPU's processing power or the like.

Also, the light emission control unit may calculate, as the luminance adjustment parameter, a ratio of the minimum number of vertical lines to the total number of vertical lines in the current frame. The luminance adjustment unit may adjust, when the video image is displayed with the total number of vertical lines in the current frame, the light emission luminance of the light emitting elements by performing calculation using the video image signal read out from the data storing unit and the luminance adjustment parameter.

With this configuration, the control device calculates the ratio of the minimum number of vertical lines to the total number of vertical lines in the current frame as a luminance adjustment parameter, and multiplies the light emission luminance of the light emitting elements when a video image is displayed with the minimum number of vertical lines by the luminance adjustment parameter, and thereby the light emission luminance can be weighted. As a result, the total light emission amount when a video image is displayed with the minimum number of vertical lines and the total light emission amount when a video image is displayed with the total number of vertical lines in the current frame can be made equal. Accordingly, the control device can suppress a flicker phenomenon that occurs in the display panel even if the frame period varies due to the GPU's processing power or the like.

Also, the luminance adjustment parameter may be represented by $V_{min}/V_{now}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the luminance adjustment parameter based on the minimum number of vertical lines and the total number of vertical lines in the current frame. As a result, the control device can conveniently adjust the light emission luminance of the light emitting elements, and suppress a flicker phenomenon that occurs in the display panel.

Also, the luminance adjustment parameter may be represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, the control device can adjust the light emission luminance of the light emitting elements when a video image is displayed with the total number of vertical lines in the current frame.

Also, the light emission control unit may include a storage unit that stores a plurality of the luminance adjustment parameters calculated in advance based on the minimum number of vertical lines and the total number of vertical lines in the current frame. The light emission control unit may select, from the storage unit, one of the luminance adjustment parameters that corresponds to the minimum number of vertical lines and the total number of vertical lines in the current frame. The luminance adjustment unit may adjust, when the video image is displayed with the total number of vertical lines in the current frame, the light emission luminance of the light emitting elements by performing calculation using the video image signal read out from the data storing unit and the luminance adjustment parameter selected by the light emission control unit.

With this configuration, the control device can easily adjust the light emission luminance of the light emitting elements when a video image is displayed with the total number of vertical lines in the current frame by selecting an optimal luminance adjustment parameter from the already calculated luminance adjustment parameters.

Also, in order to achieve the object described above, a display device according to one aspect of the present disclosure is a display device including: a panel unit in which a plurality of pixel circuits that include light emitting elements are arranged in rows and columns; a source driving circuit that supplies a video image signal to the pixel circuits, the video image signal being a signal that is displayed on the panel unit; a gate driving circuit that supplies a synchronization signal to the pixel circuits, the synchronization signal being a signal for controlling a display timing of the video image signal that is displayed on the panel unit; and a control device that controls the gate driving circuit and the source driving circuit. The control device includes: a data storing unit that temporarily stores the video image signal received from outside; a synchronization control unit that supplies the video image signal from the data storing unit to the display panel based on a vertical synchronization signal received from the outside or a start timing of the video image signal; a light emission control unit that controls a light emission luminance and a light emission timing of the light emitting elements; and a luminance adjustment unit that adjusts the light emission luminance of the light emitting elements when the video image signal read out from the data storing unit is displayed. The light emission control unit derives a luminance adjustment parameter for adjusting the light emission luminance of the light emitting elements when a video image is displayed with a total number of vertical lines in a current frame such that a total light emission amount of the light emitting elements during one frame period when the video image is displayed with the total number of vertical lines in the current frame is equal to a total light emission amount of the light emitting elements during one frame period when a video image is displayed with a pre-set minimum number of vertical lines. The luminance adjustment unit adjusts, based on the luminance adjustment parameter, the light emission luminance of the light emitting elements when the video image is displayed with the total number of vertical lines in the current frame.

With this configuration, the luminance adjustment parameter is derived such that the total light emission amount during one frame period when a video image is displayed with the total number of vertical lines in the current frame is equal to the total light emission amount during one frame period when a video image is displayed with the minimum number of vertical lines. Accordingly, by performing light emission luminance adjustment by using the luminance adjustment parameter, the total light emission amount during one frame period when a video image is displayed with the total number of vertical lines in the current frame can be made equal to the total light emission amount during one frame period when a video image is displayed with the minimum number of vertical lines. As a result, in the display device, even if the frame period varies due to the GPU's processing power or the like, it is possible to suppress a flicker phenomenon.

Also, the light emission control unit may calculate, as the luminance adjustment parameter, a ratio of the minimum number of vertical lines to the total number of vertical lines in the current frame. The luminance adjustment unit may adjust, when the video image is displayed with the total number of vertical lines in the current frame, the light emission luminance of the light emitting elements by performing calculation using the video image signal read out from the data storing unit and the luminance adjustment parameter.

With this configuration, the display device calculates the ratio of the minimum number of vertical lines to the total number of vertical lines in the current frame as a luminance adjustment parameter, and multiplies the light emission luminance of the light emitting elements when a video image is displayed with the minimum number of vertical lines by the luminance adjustment parameter, and thereby the light emission luminance can be weighted. As a result, the total light emission amount when a video image is displayed with the minimum number of vertical lines and the total light emission amount when a video image is displayed with the total number of vertical lines in the current frame can be made equal. Accordingly, the display device can suppress the occurrence of a flicker phenomenon even if the frame period varies due to the GPU's processing power or the like.

Also, the luminance adjustment parameter may be represented by $V_{min}/V_{now}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the luminance adjustment parameter based on the minimum number of vertical lines and the total number of vertical lines in the current frame. As a result, the display device can conveniently adjust the light emission luminance of the light emitting elements, and suppress the occurrence of a flicker phenomenon.

Also, the luminance adjustment parameter may be represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, the display device can adjust the light emission luminance of the light emitting elements when a video image is displayed with the total number of vertical lines in the current frame.

Also, the light emission control unit may include a storage unit that stores a plurality of the luminance adjustment parameters calculated in advance based on the minimum number of vertical lines and the total number of vertical lines in the current frame. The light emission control unit may select, from the storage unit, one of the luminance adjustment parameters that corresponds to the minimum number of vertical lines and the total number of vertical lines in the current frame. The luminance adjustment unit may adjust, when the video image is displayed with the total number of vertical lines in the current frame, the light emission luminance of the light emitting elements by performing calculation using the video image signal read out from the data storing unit and the luminance adjustment parameter selected by the light emission control unit.

With this configuration, the display device can easily adjust the light emission luminance of the light emitting elements when a video image is displayed with the total number of vertical lines in the current frame by selecting an optimal luminance adjustment parameter from the already calculated luminance adjustment parameters.

Also, in order to achieve the object described above, a method for driving a display panel according to one aspect of the present disclosure is a method for driving a display panel in which a plurality of pixel circuits that include light emitting elements are arranged in rows and columns, the method including: starting a frame period when a vertical synchronization signal is received or a start timing of a video image signal is detected, the frame period including a video image period and an extended period, the video image period being a period from after start of the frame period to end of supply of the video image signal to the pixel circuits, and the extended period being a period from after end of the video image period to next reception of the vertical synchronization signal or next detection of the start timing of the video image signal; deriving, by a light emission control unit, a luminance adjustment parameter based on a total number of vertical lines in a current frame notified after the reception of the vertical synchronization signal or detection of a start timing of a video image signal, the luminance adjustment parameter being a parameter for adjusting a light emission luminance of the light emitting elements when a video image is displayed with the total number of vertical lines in the current frame; initializing the pixel circuits within a predetermined period after the reception of the vertical synchronization signal or the detection of the start timing of the video image signal; temporarily storing the video image signal in a data storing unit after the reception of the vertical synchronization signal or the detection of the start timing of the video image signal; adjusting, by a luminance adjustment unit, the light emission luminance of the light emitting elements by performing calculation using the video image signal read out from the data storing unit and the luminance adjustment parameter; and after the initializing of the pixel circuits and during the video image period, causing the light emitting elements to emit light at the adjusted light emission luminance to display the video image signal. In the deriving of the luminance adjustment parameter, the luminance adjustment parameter is derived such that a total light emission amount of the light emitting elements during one frame period when the video image is displayed with the total number of vertical lines in the current frame is equal to a total light emission amount of the light emitting elements during one frame period when a video image is displayed with a pre-set minimum number of vertical lines.

With this configuration, the luminance adjustment parameter is derived such that the total light emission amount during one frame period when a video image is displayed with the total number of vertical lines in the current frame is equal to the total light emission amount during one frame period when a video image is displayed with the minimum number of vertical lines. Accordingly, by performing light emission luminance adjustment by using the luminance adjustment parameter, the total light emission amount during one frame period when a video image is displayed with the total number of vertical lines in the current frame can be made equal to the total light emission amount during one frame period when a video image is displayed with the minimum number of vertical lines. As a result, in the display panel, even if the frame period varies due to the GPU's processing power or the like, it is possible to suppress a flicker phenomenon.

Also, in the deriving of the luminance adjustment parameter, a ratio of the minimum number of vertical lines to the total number of vertical lines in the current frame may be calculated by the light emission control unit as the luminance adjustment parameter, and in the adjusting of the light emission luminance, the light emission luminance of the light emitting elements may be adjusted by the luminance adjustment unit performing calculation using the video image signal read out from the data storing unit and the luminance adjustment parameter when the video image is displayed with the total number of vertical lines in the current frame.

With this configuration, in the display panel, it is possible to calculate the ratio of the minimum number of vertical lines to the total number of vertical lines in the current frame as a luminance adjustment parameter, and multiply the light emission luminance of the light emitting elements when a video image is displayed with the minimum number of vertical lines by the luminance adjustment parameter, and thereby weight the light emission luminance. As a result, the total light emission amount when a video image is displayed with the minimum number of vertical lines and the total light emission amount when a video image is displayed with the total number of vertical lines in the current frame can be made equal. Accordingly, in the display panel, it is possible to suppress the occurrence of a flicker phenomenon even if the frame period varies due to the GPU's processing power or the like.

Also, the luminance adjustment parameter may be represented by $V_{min}/V_{now}$, where $V_{min}$ is the minimum number of vertical lines, and $V_{now}$ is the total number of vertical lines in the current frame.

With this configuration, when the light emission control unit is notified of the total number of vertical lines in the current frame from the outside, the control device can easily calculate the luminance adjustment parameter based on the minimum number of vertical lines and the total number of vertical lines in the current frame. As a result, in the display panel, the light emission luminance of the light emitting elements is conveniently adjusted, and it is therefore possible to suppress the occurrence of a flicker phenomenon.

Also, the luminance adjustment parameter may be represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

With this configuration, even if the total number of vertical lines in the current frame is not supplied to the light emission control unit from the outside, if the difference between the minimum number of vertical lines and the total number of vertical lines in the current frame is supplied, in the display panel, it is possible to adjust the light emission luminance of the light emitting elements when a video image is displayed with the total number of vertical lines in the current frame.

Also, in the deriving of the luminance adjustment parameter, the luminance adjustment parameter may be selected from a storage unit that stores a plurality of the luminance adjustment parameters calculated in advance based on the minimum number of vertical lines and the total number of vertical lines in the current frame, and in the adjusting of the light emission luminance, the light emission luminance of the light emitting elements may be adjusted by the luminance adjustment unit performing calculation using the video image signal read out from the data storing unit and the luminance adjustment parameter selected by the light emission control unit when the video image is displayed with the total number of vertical lines in the current frame.

With this configuration, in the display panel, it is possible to easily adjust the light emission luminance of the light emitting elements when a video image is displayed with the total number of vertical lines in the current frame by selecting an optimal luminance adjustment parameter from the already calculated luminance adjustment parameters.

Advantageous Effects

With the display panel control device, the display device, and the method for driving a display device according to the present disclosure, it is possible to suppress a flicker phenomenon.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 9 is a diagram showing an example of a light emission luminance table stored in the display device according to Embodiment 3.

DESCRIPTION OF EMBODIMENTS

Figure 1:
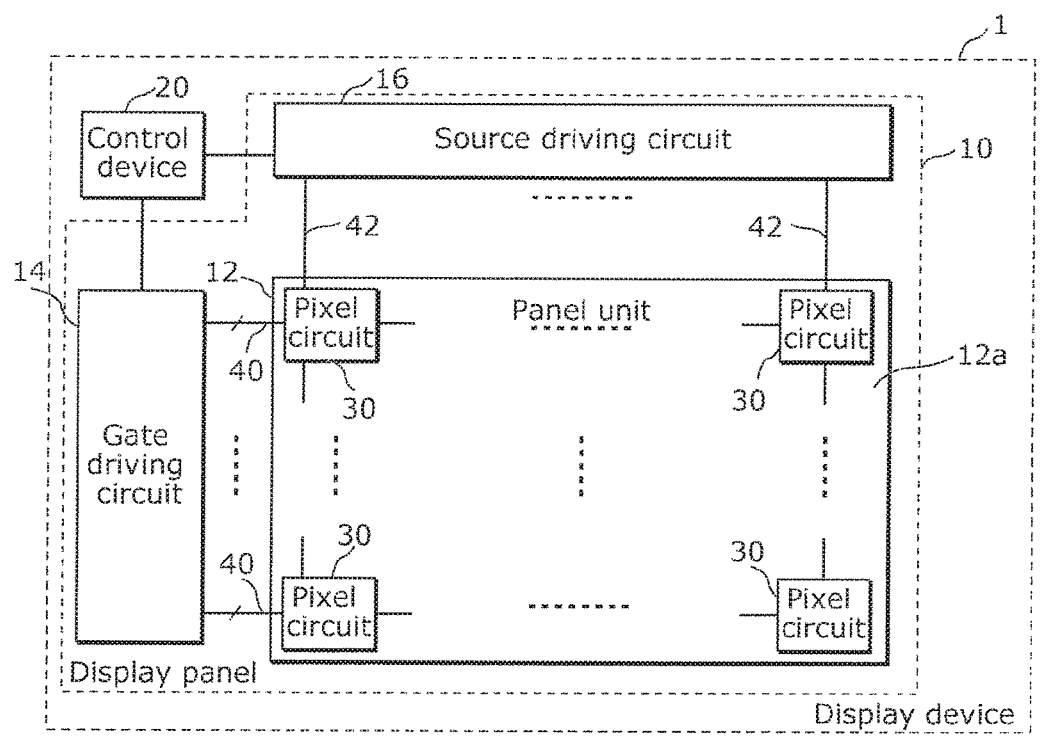
FIG. 1 is a schematic diagram showing an example of a configuration of a display device according to Embodiment 1.

Hereinafter, embodiments according to the present disclosure will be described. The embodiments described below are specific examples of the present disclosure. Accordingly, the numerical values, shapes, materials, structural elements, the arrangement and connection of the structural elements, steps, the order of the steps, and the like shown in the following embodiments are merely examples, and therefore are not intended to limit the scope of the present disclosure. Thus, among the structural elements described in the following embodiments, structural elements not recited in any one of the independent claims are described as arbitrary structural elements.

Also, the diagrams are schematic representations, and thus are not necessarily true to scale. In the diagrams, structural elements that are substantially the same are given the same reference numerals, and a redundant description is omitted or simplified.

Embodiment 1

Hereinafter, Embodiment 1 will be described with reference to FIGS. 1 to 7. The present embodiment will be described by taking a display device 1 that uses organic electroluminescent (EL) elements as an example of the display device according to the present disclosure.

[1. Configuration of Display Device]

Figure 2:
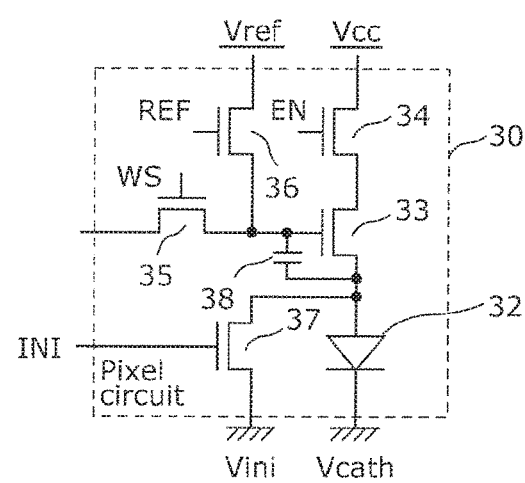
FIG. 2 is a circuit diagram showing a configuration of a pixel circuit according to Embodiment 1.
Figure 3:
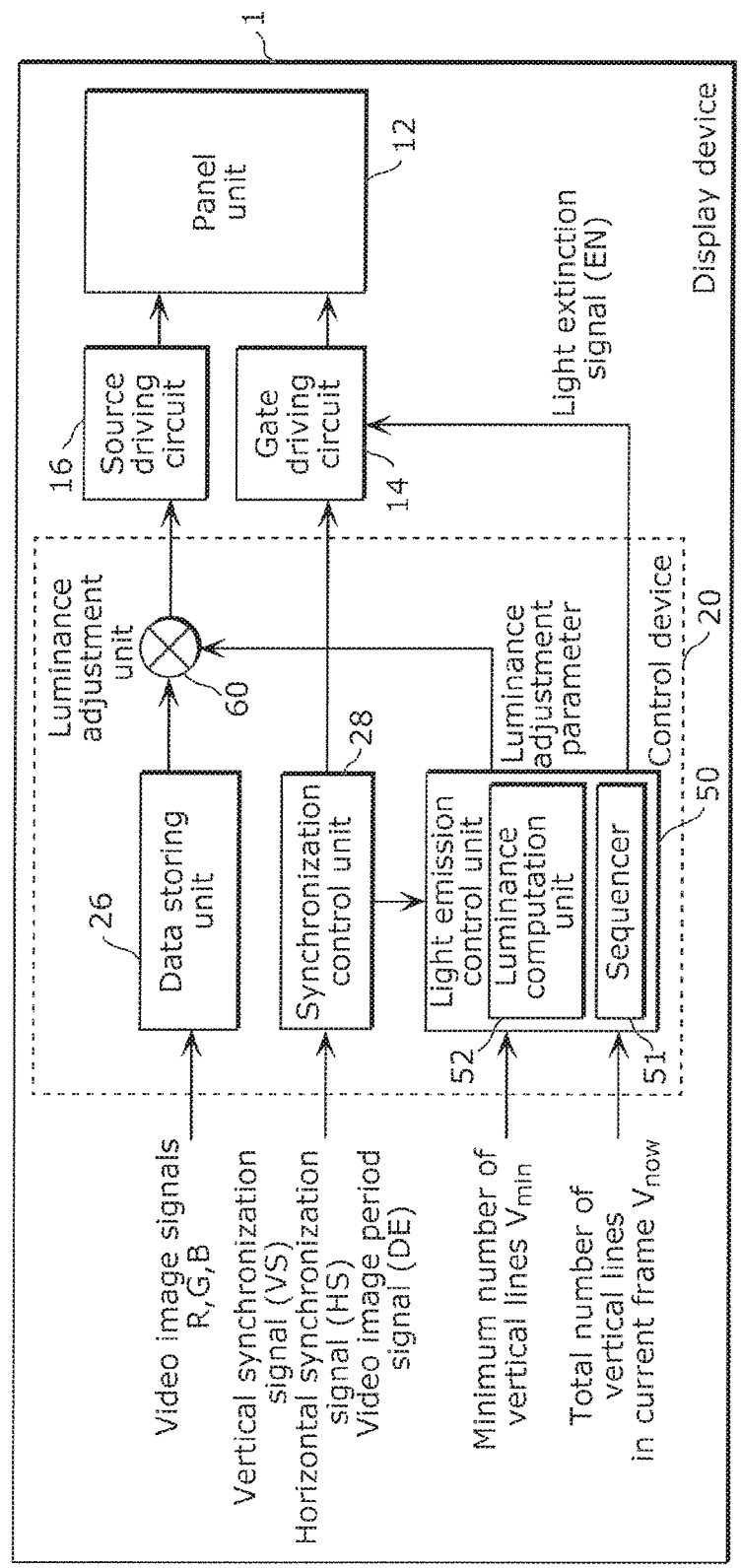
FIG. 3 is a block diagram showing a configuration of a display device according to Embodiment 1.

First, a configuration of a display device 1 will be described. FIG. 1 is a schematic diagram showing an example of a configuration of the display device 1 according to the present embodiment. FIG. 2 is a circuit diagram showing a configuration of a pixel circuit 30 according to the present embodiment. FIG. 3 is a block diagram showing a configuration of the display device 1 according to the present embodiment.

As shown in FIG. 1, the display device 1 includes a display panel 10, and a control device 20. The display panel 10 includes a panel unit 12, a gate driving circuit 14, a source driving circuit 16, scanning lines 40, and signal lines 42. The panel unit 12, the gate driving circuit 14, the source driving circuit 16, the scanning lines 40, and the signal lines 42 are mounted on, for example, a panel substrate 12a.

The panel unit 12 includes a panel substrate 12a that was mentioned above, a plurality of pixel circuits 30 that are arranged in rows and columns on the panel substrate 12a, scanning lines 40, and signal lines 42 that were also mentioned above. To be more specific, the panel unit 12 includes scanning lines 40 arranged in rows, signal lines 42 arranged in columns, and pixel circuits 30 each including a light emitting element 32 disposed at a portion where a scanning line and a signal line intersects. The panel substrate 12a is made of, for example, glass or a resin such as acrylic resin.

The plurality of pixel circuits 30 are formed on the panel substrate 12a by, for example, a semiconductor process. The plurality of pixel circuits 30 are arranged in, for example, N rows and M columns. The values N and M vary depending on the size and resolution of the display screen. For example, in the case where pixel circuits 30 corresponding to three primary colors of R, G, and B are provided side by side in a row at a resolution called a high definition (HD), N represents at least 1080 rows, and M represents at least 1920×3 columns. Each pixel circuit 30 includes an organic EL element as the light emitting element, and constitutes any one of the light emitting pixels of three primary colors of R, G, and B.

As shown in FIG. 2, a pixel circuit 30 includes a light emitting element 32, a driving transistor 33, a selection transistor 35, switch transistors 34, 36 and 37, and a pixel capacitor 38. A configuration and operations of the pixel circuit 30 will be described later in detail.

A scanning line 40 is provided for each row of the plurality of pixel circuits 30 that are arranged in rows and columns. One end of the scanning line 40 is connected to the output terminal of a corresponding stage of the gate driving circuit 14.

A signal line 42 is provided for each column of the plurality of pixel circuits 30 that are arranged in rows and columns. One end of the signal line 42 is connected to the output terminal of a corresponding stage of the source driving circuit 16.

The gate driving circuit 14 is a driving circuit that is also called "row driving circuit" and that scans a gate driving signal per row of the pixel circuits 30. The gate driving signal is a signal that is input into the gates of the driving transistor 33, the selection transistor 35, and the switch transistors 34, 36 and 37 of each pixel circuit 30 so as to perform control to turn each transistor on and off. The gate driving circuit 14 outputs, for example, a control signal WS, a light extinction signal EN, a control signal REF, and a control signal INI as the signals for controlling the selection transistor 35, and the switch transistors 34, 36 and 37. Also, as shown in FIG. 1, the gate driving circuit 14 is provided on one of the short sides of the panel unit 12.

The gate driving circuit 14 is, for example, a shift register, or the like. In response to receiving a video image period signal DE from the control device 20, the gate driving circuit 14 outputs a gate driving signal in synchronization with a vertical synchronization signal VS that is also provided from the control device 20, and drives the scanning lines 40. As a result, pixel circuits 30 are line sequentially selected for each frame, and the light emitting elements 32 of the pixel circuits 30 emit light at a luminance according to the video image signal.

As shown in FIG. 1, the gate driving circuit 14 may be provided on one of the short sides of the panel unit 12, or may be provided on each of the opposing short sides of the panel unit 12. As a result of the gate driving circuit 14 being provided on each of the opposing short sides of the panel unit 12, it is possible to supply the same gate driving signal to the plurality of pixel circuits 30 that are disposed on the panel unit 12 at the same timing. Accordingly, for example, if the panel unit 12 is large-sized, it is possible to suppress a signal degradation caused by the interconnect capacitance of the scanning lines 40.

The source driving circuit 16 is a driving circuit that is also called "column driving circuit" and that supplies a video image signal that is supplied per frame from the control device 20 to each pixel circuit 30. The source driving circuit 16 is provided on one of the long sides of the panel unit 12.

The source driving circuit 16 is a current writing type or voltage writing type driving circuit that writes luminance information based on the video image signal into each pixel circuit 30 in the form of a current value or a voltage value through the signal lines 42. As the source driving circuit 16 according to the present embodiment, for example, a voltage writing type driving circuit is used. The source driving circuit 16 supplies a voltage that represents the brightness of the light emitting element 32 provided in each pixel circuit 30 to the signal lines 42 based on the video image signal input from the control device 20.

The video image signal input from the control device 20 to the source driving circuit 16 includes, for example, digital serial data of each of three primary colors of R, G, and B (video image signals R, G, and B). The video image signals R, G, and B input to the source driving circuit 16 are converted to parallel data per row within the source driving circuit 16. Furthermore, the parallel data per row is converted to analog data per row within the source driving circuit 16, which is then output to the corresponding signal line 42. The voltage output to the signal line 42 is written into the pixel capacitors 38 of the pixel circuits 30 that belong to the row selected through scanning performed by the gate driving circuit 14. That is, an electric charge corresponding to the voltage output to the signal line 42 is accumulated in the pixel capacitors 38.

As shown in FIG. 1, the source driving circuit 16 may be provided on one of the long sides of the panel unit 12, or may be provided on each of the opposing long sides of the panel unit 12.

With this configuration, for example, if the panel unit 12 is large-sized, it is possible to output voltage to the pixel circuits 30 of the same column at the same timing.

[2. Configuration of Pixel Circuit]

As shown in FIG. 2, a pixel circuit 30 includes a light emitting element 32, a driving transistor 33, a selection transistor 35, switch transistors 34, 36 and 37, and a pixel capacitor 38.

The light emitting element 32 is, for example, a diode-type organic EL element that includes an anode and a cathode. The light emitting element 32 is not limited to an organic EL element, and may be any other light emitting element. For example, the light emitting element 32 can be any ordinary element that is current-driven and emits light.

The light emitting element 32 includes; for example, a plurality of first electrode layers that are made of transparent conductive films; an organic layer in which a positive hole transport layer, a light emission layer, an electron transport layer, and an electron injection layer are deposited in this order on the first electrode layers; and a second electrode layer that is made of a metal film and is provided on the organic layer. In FIG. 2, the light emitting element 32 is schematically indicated by a symbol. When a direct current voltage is applied between the first electrode layers and the second electrode layer of the light emitting element 32, recombination of electrons and positive holes takes place in the light emission layer. As a result, due to the drain-to-source current of the driving transistor 33 supplied from the driving transistor 33, the light emitting element 32 emits light at a luminance according to the signal potential of the video image signal.

The driving transistor 33 is an active element that drives the light emitting element 32 to emit light. The driving transistor 33 supplies the drain-to-source current that corresponds to the gate-to-source voltage to the light emitting element 32 by being turned on.

The switch transistor 34 is turned on or off according to the light extinction signal EN supplied from the scanning line 40. The switch transistor 34 connects the driving transistor 33 to a power supply Vcc by being turned on, and the drain-to-source current of the driving transistor 33 is supplied to the light emitting element 32.

The selection transistor 35 is turned on according to the control signal WS supplied from the scanning line 40, and an electric charge corresponding to the signal potential of the video image signal supplied from the signal line 42 is accumulated in the pixel capacitor 38.

The switch transistor 36 is turned on according to the control signal REF supplied from the scanning line 40, and sets the source of the driving transistor 33 to a reference voltage Vref.

The switch transistor 37 is turned on according to the control signal INI supplied from the scanning line 40, and sets the source of the driving transistor 33 to a reference voltage Vini.

The pixel capacitor 38 applies a voltage to the gate of the driving transistor 33 according to the signal potential based on the accumulated electric charge.

The driving transistor 33, the selection transistor 35, the switch transistor 36, and the switch transistor 37 are, for example, N channel type polysilicon TFTs (Thin Film Transistors). Also, the switch transistor 34 is, for example, a P channel type polysilicon TFT. The conductivity type of the transistors is not limited to the above, and N channel type and P channel type TFTs may be mixed as appropriate. Also, the transistors are not limited to polysilicon TFTs, and may be amorphous silicon TFTs, or the like.

Operations performed by the pixel circuit 30 will now be described. Immediately before a frame period starts, all of the control signals WS, REF, and INI as well as the light extinction signal EN are at a low level. In this state, the selection transistor 35, the switch transistor 36, and the switch transistor 37 that are N channel type transistors are turned off. On the other hand, the switch transistor 34 that is a P channel type transistor is turned on.

Accordingly, the driving transistor 33 is connected to the power supply Vcc via the switch transistor 34 that is in an on-state. As a result, the driving transistor 33 supplies the drain-to-source current to the light emitting element 32 according to the gate-to-source voltage of the driving transistor 33. At this time, the light emitting element 32 emits light.

When the frame period starts, the light extinction signal EN is switched from the low level to a high level. In response thereto, the switch transistor 34 is turned off, and the driving transistor 33 is disconnected from the power supply Vcc. Accordingly, the light emitting element 32 stops emitting light, and a light extinction period starts. Also, all of the selection transistor 35, the switch transistor 36, the switch transistor 37, and the switch transistor 34 are turned off.

During an initialization period, first, the reference voltage Vref is changed to a voltage at which the driving transistor 33 is turned off when the control signal REF is set to a high level. Next, the control signal REF is set to a high level, and the switch transistor 36 is turned on. In response thereto, the gate of the driving transistor 33 is connected to the reference voltage Vref, and the driving transistor 33 is turned off. When the driving transistor 33 is turned off, the control signal REF is again set to a low level, and the switch transistor 36 is turned off. Furthermore, the reference voltage Vref is brought back to the original voltage.

Next, the control signal INI is set to a high level, and the switch transistor 37 is turned on. In response thereto, the source of the driving transistor 33 is initialized to the reference voltage Vini. Then, when the control signal REF is set to a high level, the switch transistor 36 is turned on. In response thereto, the gate of the driving transistor 33 is initialized to the reference voltage Vref. As a result, the gate of the driving transistor 33 is connected to the reference voltage Vref, and the source is connected to the reference voltage Vini.

Here, the reference voltage Vref, the reference voltage Vini, and a threshold voltage Vth of the driving transistor 33 may satisfy the relationship: Vref−Vini>Vth. By doing so, the threshold voltage Vth of the driving transistor 33 can be corrected later. Also, by setting a threshold voltage of the light emitting element 32 to be greater than the reference voltage Vini, a minus bias is applied to the light emitting element 32, and the light emitting element 32 is brought into a so-called reverse bias state.

When the initialization period ends, the threshold voltage Vth of the driving transistor 33 is detected, and the threshold voltage Vth is corrected if necessary (Vth correction period). After the control signal INI is set to a low level, the light extinction signal EN is set to a low level. In response thereto, the switch transistor 37 is turned off, and the switch transistor 34 is turned on. Then, the drain-to-source current of the driving transistor 33 flows through the pixel capacitor 38, and the correction of the threshold voltage Vth is performed.

At this time, the gate of the driving transistor 33 is held at the reference voltage Vref, and the drain-to-source current of the driving transistor 33 flows through the driving transistor 33 until the driving transistor 33 is cut off. When the driving transistor 33 is cut off, the source of the driving transistor 33 has a potential Vref−Vth.

Then, the light extinction signal EN is again set to a high level, and the switch transistor 34 is turned off. Furthermore, the control signal REF is set to a low level, and the switch transistor 36 is turned off. The threshold voltage Vth is thereby held in the pixel capacitor 38.

After that, the light extinction signal EN is again set from the low level to a high level, and the control signal REF is set from the high level to a low level. Subsequently, the control signal WS is set from the low level to a high level. As a result, the signal potential of the video image signal is written into the pixel capacitor 38.

Furthermore, the light extinction signal EN is set from the high level to a low level. The light emitting element 32 thereby starts emitting light.

By repeating the frame period described above, the light emitting elements 32 that are arranged in rows and columns sequentially emit light according to the signal potential of the video image signal, and a video image is displayed on the panel unit 12.

[3. Configuration of Control Device]

Next, a configuration of the control device 20 will be described.

The control device 20 is formed on an external system circuit substrate (not shown) provided outside the display panel 10. The control device 20 functions as, for example, a TCON (Timing Controller), and controls the overall operations of the display device 1. To be specific, the control device 20 provides an instruction to perform scanning to the gate driving circuit 14 according to a vertical synchronization signal VS, a horizontal synchronization signal HS, and a video image period signal DE that are supplied from the outside. Also, the control device 20 supplies digital serial data of video image signals R, G, and B to the source driving circuit 16.

As shown in FIG. 3, the control device 20 includes a data storing unit 26, a synchronization control unit 28, a light emission control unit 50, and a luminance adjustment unit 60. The control device 20 may include a receiver (not shown) that receives a signal supplied from the outside and supplies the signal to the data storing unit 26, the synchronization control unit 28, and the light emission control unit 50.

The data storing unit 26 is a buffer that temporarily stores the video image signals R, G, and B. The data storing unit 26 includes, for example, 100 line buffers. The data storing unit 26 sequentially stores the video image signals R, G, and B for each line received from the outside, and outputs the video image signals to the luminance adjustment unit 60 at a predetermined timing.

The synchronization control unit 28 is a control unit that controls the timing at which the video image signals R, G, and B are displayed on the panel unit 12. The synchronization control unit 28 receives a vertical synchronization signal VS, a horizontal synchronization signal HS, and a video image period signal DE from the outside, and outputs the signals to the gate driving circuit 14 and the source driving circuit 16. Also, the synchronization control unit 28 outputs, to the light emission control unit 50, a synchronization control signal for the light emission control unit 50 to cause each light emitting element 32 to emit or extinguish light at a desired timing.

The light emission control unit 50 is a control unit that controls the gate driving circuit 14 and the source driving circuit 16 such that the video image signals R, G, and B are displayed on the panel unit 12 at a desired timing and a desired luminance. As shown in FIG. 3, the light emission control unit 50 includes a sequencer 51 and a luminance computation unit 52.

The sequencer 51 generates a sequence for controlling the display timing of the video image signals R, G, and B based on, for example, the vertical synchronization signal VS, the horizontal synchronization signal HS, and the video image period signal DE that are supplied from the outside. The sequencer 51 may include a timer (not shown) that counts, during a video image period received from the outside, a light extinction period during which the light emitting element 32 extinguishes light and a light emission period during which the light emitting element 32 emits light based on the synchronization control signal supplied from the synchronization control unit 28. The sequencer 51 may set the duty ratio (on-duty ratio) between the light emission period and the light extinction period within one frame according to the video image period signal DE.

The light emission control unit 50 generates a light extinction signal EN based on the sequence generated by the sequencer 51, and supplies the light extinction signal EN to the gate driving circuit 14. In response thereto, the gate driving circuit 14 supplies or stops supplying the light extinction signal EN to the switch transistor 34 of the pixel circuit 30, and controls each light emitting element 32 to emit or extinguish light. The sequence (timing chart) generated by the sequencer 51 will be described later in detail.

The luminance computation unit 52 is a computation unit that calculates a luminance adjustment parameter for adjusting the light emission luminance of the light emitting elements 32. The luminance computation unit 52 calculates the luminance adjustment parameter such that the total amount of light emission luminance of the light emitting elements 32 in each frame is constant. To be specific, the luminance computation unit 52 calculates a luminance adjustment parameter for adjusting the luminance of the light emitting elements 32 in the current frame based on a minimum number $V_{min}$ of vertical lines required to render one frame and a total number $V_{now}$ of vertical lines in the current frame that are supplied from the outside. The light emission control unit 50 supplies the luminance adjustment parameter calculated by the luminance computation unit 52 to the luminance adjustment unit 60. A specific method for calculating the luminance adjustment parameter will be described later in detail.

The luminance adjustment unit 60 adjusts the luminance of the video image signals R, G, and B temporarily stored in the data storing unit 26 based on the luminance adjustment parameter supplied from the light emission control unit 50, and outputs the luminance to the source driving circuit 16. For example, the luminance adjustment unit 60 adjusts the luminance of the video image signals R, G, and B by multiplying the luminance of the video image signals R, G, and B supplied from the data storing unit 26 by the luminance adjustment parameter described above. However, the luminance adjustment unit 60 does not necessarily adjust the luminance of the video image signals R, G, and B by multiplying the luminance of the video image signals R, G, and B supplied from the data storing unit 26 by the luminance adjustment parameter, and may adjust the luminance of the video image signals R, G, and B by performing calculation other than multiplication such as addition or subtraction.

[4. Operations of Control Device]

A description will now be given of operations performed in the control device 20 according to the present embodiment.

The display device 1 according to the present embodiment is driven by, for example, a progressive driving scheme for organic EL light emitting panels. To be specific, the control device 20 performs control so as to cause the panel unit 12 in which a plurality of pixel circuits 30 are arranged in rows and columns to perform an initialization operation, a write operation, and a light emission operation in a row-sequential manner. That is, under the control of the control device 20, an initialization operation, a write operation, and a light emission operation are sequentially performed from the first row to the last row in the panel unit 12. This period will be referred to as a "frame period". The frame period may include a threshold voltage Vth detection operation of detecting the threshold voltage Vth of the driving transistor 33, and the like, in addition to the initialization operation, the write operation, and the light emission operation.

Figure 4:
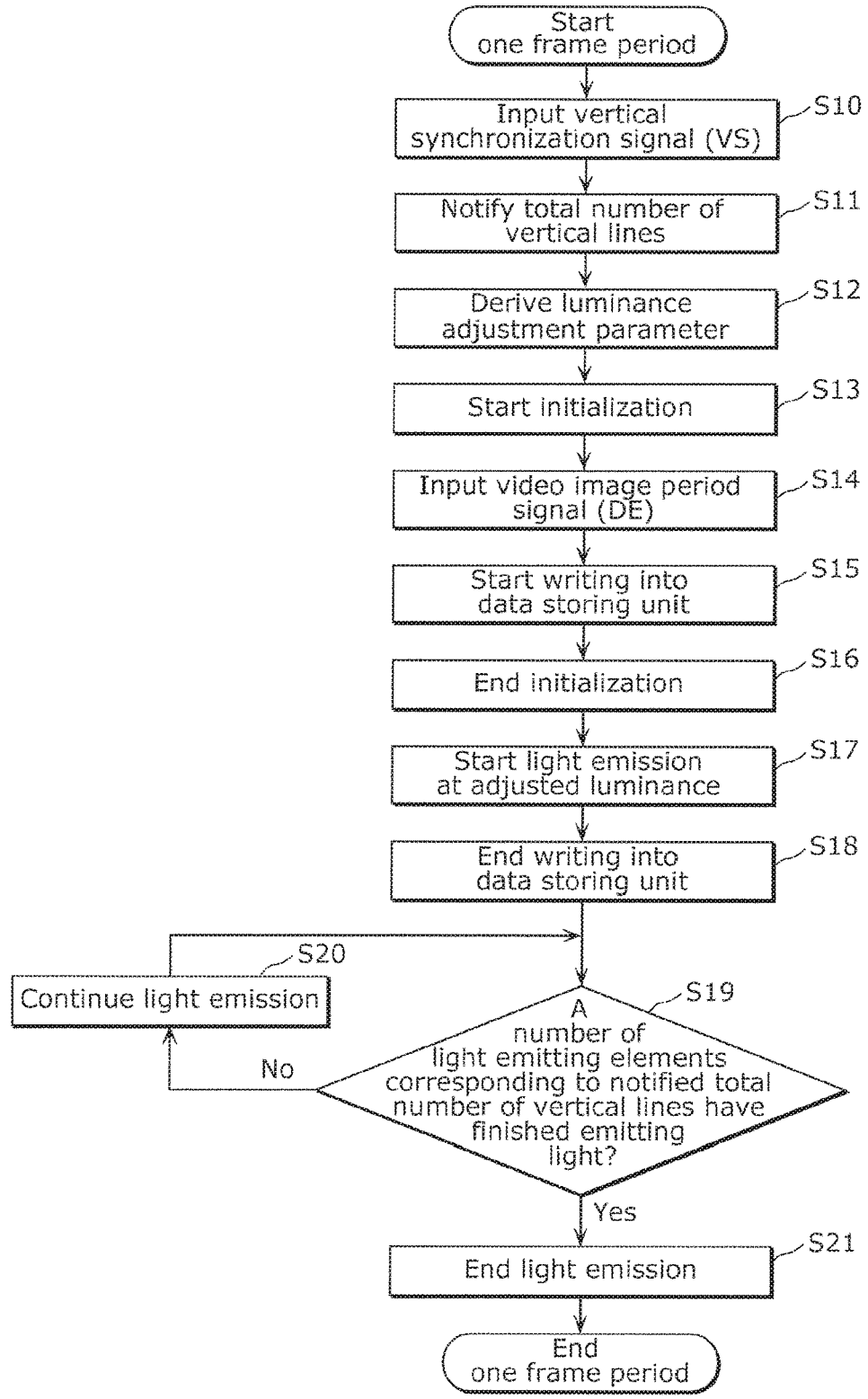
FIG. 4 is a flowchart illustrating operations performed during one frame period in a control device according to Embodiment 1.
Figure 5:
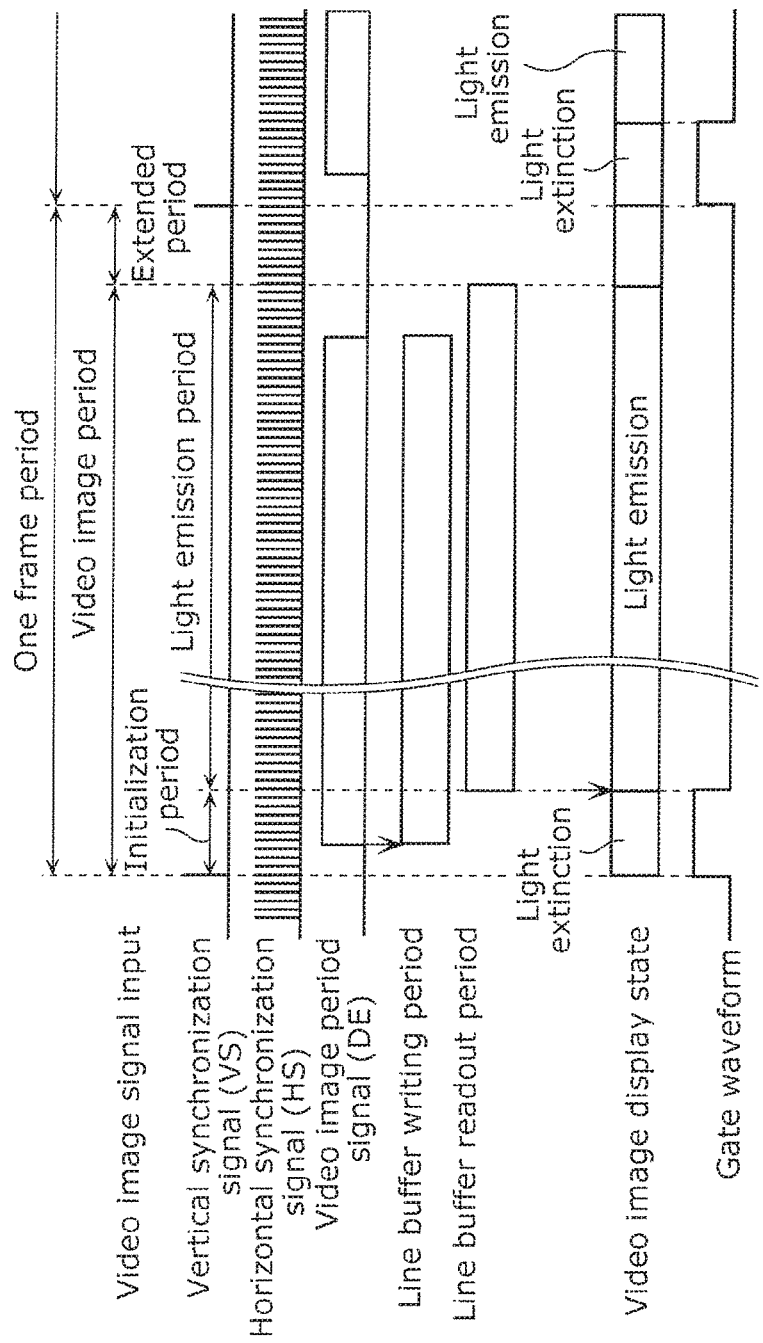
FIG. 5 is a timing chart schematically illustrating operations performed in the control device according to Embodiment 1.

Hereinafter, basic operations performed in the control device 20 according to the present embodiment will be described. FIG. 4 is a flowchart illustrating operations performed during one frame period in the control device 20 according to the present embodiment. FIG. 5 is a timing chart schematically illustrating operations performed in the control device 20 according to the present embodiment. FIG. 5 shows the operations of one line's worth of pixel circuits 30 in the panel unit 12.

In the example given below, operations performed in the case where the on-duty ratio is 90% will be described. In the example given below, the video image period is set to a period of 100 pulses of the horizontal synchronization signal, the light extinction period (initialization period) is set to a period of 10 pulses of the horizontal synchronization signal, and the light emission period is set to a period of 90 pulses of the horizontal synchronization signal.

As shown in FIGS. 4 and 5, in the control device 20, a video image period is started when a vertical synchronization signal VS is supplied (step S10). The vertical synchronization signal VS is supplied to the synchronization control unit 28 of the control device 20 from the outside. The vertical synchronization signal VS supplied to the synchronization control unit 28 is output from the synchronization control unit 28 to the light emission control unit 50.

Also, the light emission control unit 50 is notified of the total number of vertical lines in each frame period from the outside (step S11). The total number of vertical lines is notified to the light emission control unit 50 immediately after the vertical synchronization signal VS has been supplied to the synchronization control unit 28. The total number of vertical lines that is notified includes a minimum number $V_{min}$ of vertical lines required to render one frame and a total number $V_{now}$ of vertical lines in the current frame. The minimum number $V_{min}$ of vertical lines is, for example, 1080 lines in the case of FHD resolution, and 2160 lines in the case of 4K UHD resolution. The minimum number $V_{min}$ of vertical lines is the same throughout the frames.

Next, a luminance adjustment parameter for adjusting luminance when the light emitting elements 32 are caused to emit light is derived (parameter deriving step) (step S12). As will be described later, the luminance adjustment parameter is derived from the minimum number $V_{min}$ of vertical lines required to render one frame and the total number $V_{now}$ of vertical lines in the current frame that were notified. The derived luminance adjustment parameter is output to the luminance adjustment unit 60. Then, in steps S17 to S21, which will be described later, the luminance adjustment unit 60 multiplies the light emission luminance of the light emitting elements 32 when a video image is displayed with the minimum number $V_{min}$ of vertical lines by the luminance adjustment parameter when the video image signals R, G, and B output from the data storing unit 26 are supplied to the source driving circuit 16. The method for deriving the luminance adjustment parameter will be described later in detail.

Next, when the vertical synchronization signal VS is output from the synchronization control unit 28, and the light emission control unit 50 receives the vertical synchronization signal VS, a light extinction signal EN is supplied from the light emission control unit 50 to the gate driving circuit 14. The light extinction signal EN is supplied from the gate driving circuit 14 to the gate of the switch transistor 34 of each pixel circuit 30. In response thereto, the switch transistor 34 is turned off, and the light emitting element 32 enters a light extinguishing state. Then, an initialization period starts (step S12). The start timing of the initialization period is not limited to when the light emission control unit 50 receives the vertical synchronization signal VS, and may be when the light emission control unit 50 detects start timing of input of a video image period signal DE.

Figure 7:
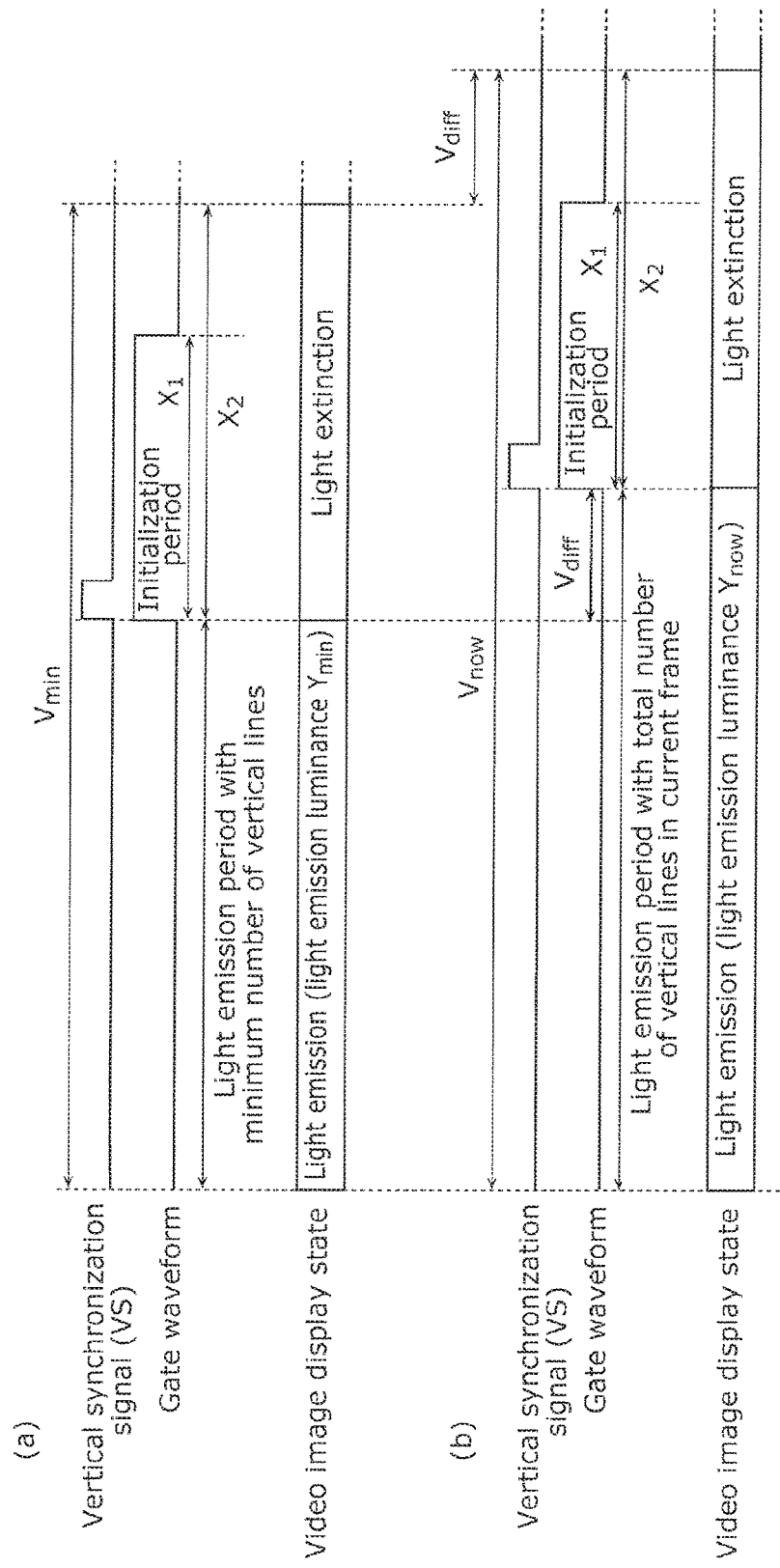
FIG. 7 is a diagram illustrating the light emission luminance of control devices according to Embodiments 1 and 2, with (a) showing an example when a video image is displayed with a minimum number of vertical lines, and (b) showing an example when a video image is displayed with a total number of vertical lines in a current frame.

During the initialization period, a gate signal for initialization is supplied from the gate driving circuit 14 to each pixel circuit 30 in the panel unit 12. In response thereto, the transistors of each pixel circuit 30 operate as described above, and the pixel circuit 30 is initialized (Initialization step). During the initialization period, the light emitting element 32 is in a light extinguishing state, but as shown in FIG. 7, which will be described later, the light emitting element 32 may be in a light extinguishing state for a predetermined period between when the supply of the gate signal is stopped and the initialization period ends and when the next vertical synchronization signal VS is supplied.

A video image period signal DE is also supplied to the synchronization control unit 28 of the control device 20 from the outside (step S13). The supply of the video image period signal DE may be performed during the initialization period, or may be performed after the end of the initialization period. Here, it is assumed that the video image period signal DE is supplied during the initialization period.

When the video image period signal DE is supplied to the synchronization control unit 28, the writing of the video image signal is started (step S14). In response to the input of the video image period signal DE, the video image signal output from the source driving circuit 16 is temporarily written into the data storing unit 26 (writing step). The writing of the video image signal is continued while the video image period signal DE is supplied. The start timing of the writing step is not limited to when the input of the video image period signal DE into the synchronization control unit 28 is started, and may be when the light emission control unit 50 receives the vertical synchronization signal VS.

When a predetermined period passes from the start of initialization, and one line's worth of pixel circuits 30 are initialized, the initialization period ends (step S16). The initialization period may end when the light extinction period for initialization reaches a pre-set period.

When the initialization period ends, the readout of the video image signal from the data storing unit 26 is started (readout step). Also, the supply of the light extinction signal EN from the gate driving circuit 14 to the pixel circuit 30 is stopped. Accordingly, the supply of the light extinction signal EN to the gate of the switch transistor 34 is stopped, and the switch transistor 34 is turned on. In response thereto, the light emitting element 32 starts emitting light (step S17).

The light emitting element 32 emits light according to the video image signal readout from the data storing unit 26. At this time, the video image signal readout from the data storing unit 26 is computed with the luminance adjustment parameter in the luminance adjustment unit 60, and the light emission luminance when light is emitted from the light emitting element 32 of each pixel circuit 30 is adjusted (luminance adjusting step). The video image signal whose light emission luminance has been adjusted is supplied to the source driving circuit 16. The source driving circuit 16 causes the light emitting element 32 of each pixel circuit 30 in the panel unit 12 to emit light based on the supplied video image signal. The video image signal is thereby displayed on the panel unit 12 (video image display step).

Also, when the supply of the video image period signal DE is stopped, the writing of the video image signal into the data storing unit 26 ends (step S18).

Here, if a number of light emitting elements 32 corresponding to the total number of vertical lines in the current frame notified from the outside have not finished emitting light (No in step S19), the light emission of the light emitting elements 32 is continued (step S20).

If, on the other hand, a number of light emitting elements 32 corresponding to the total number of vertical lines in the current frame notified from the outside have finished emitting light (Yes in step S19), the light extinction signal EN is again supplied from the gate driving circuit 14 to each pixel circuit 30. The light emission of the light emitting elements 32 during one frame period thereby ends (step S21).

As described above, the video image period is set to a period of 100 pulses of the horizontal synchronization signal, the light extinction period (initialization period) is set to a period of 10 pulses of the horizontal synchronization signal, and the light emission period is set to a period of 90 pulses of the horizontal synchronization signal, but the periods are not necessarily set to the above-described values, and the video image period, the light extinction period, and the light emission period may be changed as appropriate.

[5. Calculation of Luminance Adjustment Parameter]

Figure 6:
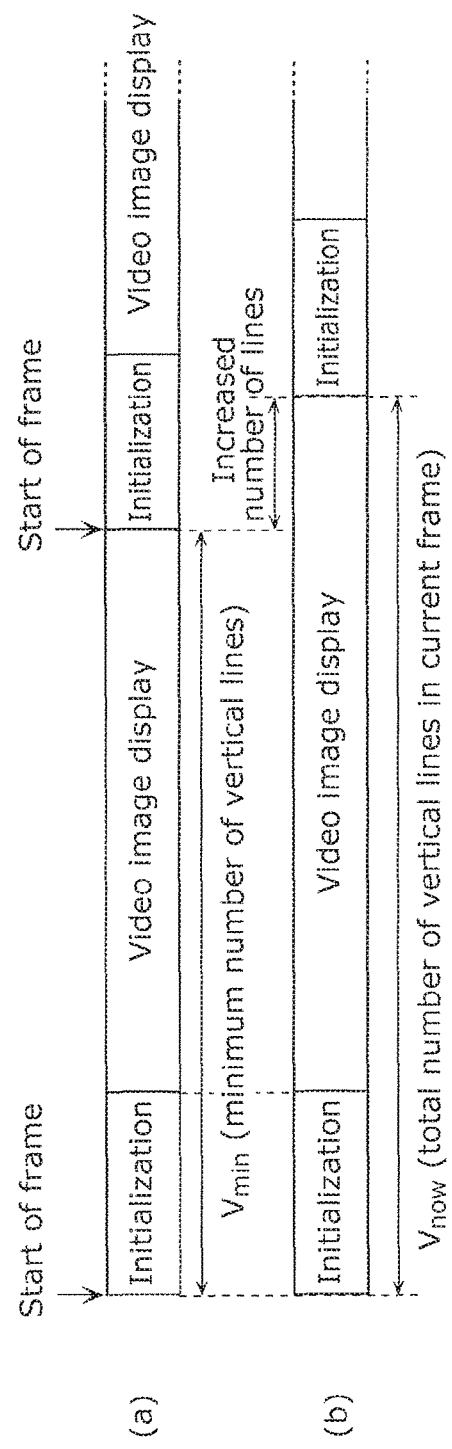
FIG. 6 is a diagram illustrating a feature of the operations performed in the control device according to Embodiment 1, with (a) showing an example when a video image is displayed with a minimum number of vertical lines, and (b) showing an example when a video image is displayed with a total number of vertical lines in a current frame.

A feature of the operations of the control device 20 according to the present embodiment and the calculation of a luminance adjustment parameter will now be described. FIG. 6 is a diagram illustrating a feature of the operations of the control device 20 according to the present embodiment, with (a) showing an example when a video image is displayed with the minimum number $V_{min}$ of vertical lines, and (b) showing an example when a video image is displayed with the total number $V_{now}$ of vertical lines in the current frame. FIG. 7 is a diagram illustrating the light emission luminance of the control device 20 according to the present embodiment, with (a) showing an example when a video image is displayed with the minimum number $V_{min}$ of vertical lines, and (b) showing an example when a video image is displayed with the total number $V_{now}$ of vertical lines in the current frame. FIGS. 6 and 7 show the operations of one line's worth of pixel circuits 30 in the panel unit 12.

In the control device 20 according to the present embodiment, it is assumed that the total number $V_{now}$ of vertical lines in the current frame is greater than the minimum number $V_{min}$ of vertical lines. For example, as described above, when a video image is displayed with the minimum number $V_{min}$ of vertical lines, the video image period is set to a period of 100 pulses of the horizontal synchronization signal, the light extinction period (initialization period) is set to a period of 10 pulses of the horizontal synchronization signal, and the light emission period is set to a period of 90 pulses of the horizontal synchronization signal. Also, when a video image is displayed with the total number $V_{now}$ of vertical lines in the current frame, the light emission period is extended by an amount corresponding to 10 pulses of the horizontal synchronization period, and thus the video image period is set to a period of 110 pulses of the horizontal synchronization signal, the light extinction period (initialization period) is set to a period of 10 pulses of the horizontal synchronization signal, and the light emission period is set to a period of 100 pulses of the horizontal synchronization signal.

A feature of the control device 20 according to the present embodiment is that it is possible to adjust the light emission luminance of the light emitting elements 32 in the current frame according to the total number $V_{now}$ of vertical lines in the current frame that has been notified from the outside.

As shown in (a) and (b) in FIG. 6, with the control device 20, in one frame period, after initialization has been performed, a video image is displayed at a predetermined luminance. Here, when a video image is displayed with the total number $V_{now}$ of vertical lines in the current frame, because the total number $V_{now}$ of vertical lines in the current frame is greater than the minimum number $V_{min}$ of vertical lines, the video image display period is extended by an amount corresponding to an increased time required to display a video image with the total number of vertical lines as compared with when a video image is displayed with the minimum number $V_{min}$ of vertical lines. For this reason, if the same light emission luminance as that used when a video image is displayed with the minimum number $V_{min}$ of vertical lines is used to cause the light emitting elements 32 to emit light when a video image is displayed with the total number $V_{now}$ of vertical lines in the current frame, the total light emission amount in one frame period increases, which causes a flicker to occur.

Accordingly, in the control device 20 according to the present embodiment, the light emission luminance is adjusted such that the total light emission amount in one frame period when a video image is displayed with the total number $V_{now}$ of vertical lines in the current frame is equal to the total light emission amount in one frame period when a video image is displayed with the minimum number $V_{min}$ of vertical lines.

To be specific, the light emission luminance $Y_{min}$ of the light emitting elements 32 when a video image is displayed with the minimum number $V_{min}$ of vertical lines is multiplied by a luminance adjustment parameter so as to weight the light emission luminance. Then, the light emitting elements 32 are caused to emit light at the weighted light emission luminance $Y_{now}$. That is, the light emission luminance of the light emitting elements 32 is adjusted by the following equation:

$$Y_{now} = P_1 \times Y_{min} \quad \text{(Equation 1)},$$

where $P_1$ is the luminance adjustment parameter.

Here, as shown in (a) and (b) in FIG. 7, when a video image is displayed with the minimum number $V_{min}$ of vertical lines and when a video image is displayed with the total number $V_{now}$ of vertical lines in the current frame, the initialization period $X_1$ and the light extinction period $X_2$ for initialization have the same length. Accordingly, the difference between the light emission period when a video image is displayed with the minimum number $V_{min}$ of vertical lines and the light emission period when a video image is displayed with the total number $V_{now}$ of vertical lines in the current frame is equal to the difference $V_{diff}$ between the minimum number $V_{min}$ of vertical lines and the total number $V_{now}$ of vertical lines in the current frame. Thus, in order to make the total light emission amount when a video image is displayed with the minimum number $V_{min}$ of vertical lines equal to the total light emission amount when a video image is displayed with the total number $V_{now}$ of vertical lines in the current frame, the light emission luminance of the light emitting elements 32 in one frame period when a video image is displayed with the total number $V_{now}$ of vertical lines in the current frame needs to be reduced according to the ratio of the minimum number $V_{min}$ of vertical lines to the total number $V_{now}$, of vertical lines in the current frame.

That is, the luminance adjustment parameter $P_1$ can be set as the ratio between one frame period when a video image is displayed with the minimum number $V_{min}$ of vertical lines and one frame period when a video image is displayed with the total number $V_{now}$ of vertical lines in the current frame. More simply stated, the luminance adjustment parameter $P_1$ can be calculated as the ratio between the minimum number $V_{min}$ of vertical lines and the total number $V_{now}$ of vertical lines in the current frame by the luminance computation unit 52:

$$P_1 = V_{min}/V_{now} \qquad \text{(Equation 2)}.$$

Accordingly, the luminance adjustment unit 60 can adjust the light emission luminance $Y_{now}$ of the light emitting elements 32 during one frame period when a video image is displayed with the total number $V_{now}$ of vertical lines in the current frame by the following equation:

$$Y_{now} = V_{min}/V_{now} \times Y_{min} \qquad \text{(Equation 3)}.$$

To be specific, in the control device 20 according to the present embodiment, the video image period when a video image is displayed with the minimum number $V_{min}$ of vertical lines is set to a period of 100 pulses of the horizontal synchronization signal, and the video image period when a video image is displayed with the total number $V_{now}$ of vertical lines in the current frame is set to a period of 110 pulses of the horizontal synchronization signal, and thus the luminance adjustment parameter $P_1$ is calculated as $P_1 = 100/110 = 0.909$ by the luminance computation unit 52. As a result, in the luminance adjustment unit 60, the light emission luminance $Y_{now}$ of the light emitting elements 32 during one frame period when a video image is displayed with the total number $V_{now}$ of vertical lines in the current frame is adjusted by the following equation: $Y_{now} = 0.909 \times Y_{min}$.

In the manner described above, the total light emission amount when a video image is displayed with the minimum number $V_{min}$ of vertical lines and the total light emission amount when a video image is displayed with the total number $V_{now}$ of vertical lines in the current frame can be made equal.

[6. Advantageous Effects, Etc.]

As described above, with the control device 20 and the display device 1 according to the present embodiment, the light emission luminance is adjusted such that the total light emission amount in one frame period when a video image is displayed with the total number $V_{now}$ of vertical lines in the current frame is equal to the total light emission amount in one frame period when a video image is displayed with the minimum number $V_{min}$ of vertical lines. At this time, the luminance adjustment parameter $P_1$ is set as $P_1 = V_{min}/V_{now}$ based on the ratio of the minimum number $V_{min}$ of vertical lines to the total number $V_{now}$ of vertical lines in the current frame, the light emission luminance $Y_{min}$ of the light emitting elements 32 when a video image is displayed with the minimum number $V_{min}$ of vertical lines is multiplied by the luminance adjustment parameter $P_1$ so as to weight the light emission luminance. As a result, the total light emission amount when a video image is displayed with the minimum number $V_{min}$ of vertical lines and the total light emission amount when a video image is displayed with the total number $V_{now}$ of vertical lines in the current frame can be made equal. Accordingly, in the display device 1 controlled by the control device 20, even if the frame period varies due to the GPU's processing power or the like, it is possible to suppress a flicker phenomenon.

In the embodiment described above, the luminance adjustment parameter $P_1$ is set as the ratio of one frame period when a video image is displayed with the minimum number $V_{min}$ of vertical lines to one frame period when a video image is displayed with the total number $V_{now}$ of vertical lines in the current frame. However, the luminance adjustment parameter $P_1$ may be set as, for example, the ratio of the light emission period when a video image is displayed with the minimum number $V_{min}$ of vertical lines to the light emission period when a video image is displayed with the total number $V_{now}$ of vertical lines in the current frame, each light emission period being obtained by excluding the light extinction period $X_2$ from one frame period.

Embodiment 2

Next, Embodiment 2 will be described. The control device 20 according to the present embodiment is different from the control device 20 according to Embodiment 1 in that in the luminance computation unit 52, the luminance adjustment parameter is calculated by using the difference $V_{diff}$ between the minimum number $V_{min}$ of vertical lines and the total number $V_{now}$ of vertical lines in the current frame.

As described above, in the luminance computation unit 52 of the control device 20 according to Embodiment 1, as shown in Equation 2, the luminance adjustment parameter $P_1$ is represented by $P_1 = V_{min}/V_{now}$.

Here, the difference $V_{diff}$ between the minimum number $V_{min}$ of vertical lines and the total number $V_{now}$ of vertical lines in the current frame can be represented by $V_{diff} = V_{now} - V_{min}$. That is, the total number $V_{now}$ of vertical lines in the current frame can be represented by $V_{now} = V_{min} + V_{diff}$. Based on this, a luminance adjustment parameter $P_2$ can be calculated in the luminance computation unit 52. The luminance adjustment parameter $P_2$ can be represented as follows:

$$\begin{aligned} P_2 &= V_{min}/(V_{min} + V_{diff}) \\ &= 1 - V_{diff}/(V_{min} + V_{diff}). \end{aligned} \qquad \text{(Equation 4)}$$

Accordingly, the luminance adjustment unit 60 can adjust the light emission luminance $Y_{now}$ of the light emitting elements 32 in one frame period when a video image is displayed with the total number $V_{now}$ of vertical lines in the current frame as follows:

$$\begin{aligned} Y_{now} &= V_{min}/(V_{min} + V_{diff}) \times Y_{min} \\ &= \{1 - V_{diff}/(V_{min} + V_{diff})\} \times Y_{min} \\ &= Y_{min} - V_{diff}/(V_{min} + V_{diff}) \times Y_{min}. \end{aligned} \qquad \text{(Equation 5)}$$

Accordingly, even if the total number $V_{now}$ of vertical lines in the current frame is not supplied to the light emission control unit 50 from the outside, if the difference $V_{diff}$ between the minimum number $V_{min}$ of vertical lines and the total number $V_{now}$ of vertical lines in the current frame is supplied, the control device 20 can adjust the light emission luminance $Y_{now}$ of the light emitting elements 32 when a video image is displayed with the total number $V_{now}$ of vertical lines in the current frame.

To be specific, in the control device 20 according to the present embodiment, the difference $V_{diff}$ between the video image period when a video image is displayed with the total number $V_{now}$ of vertical lines in the current frame and the video image period when a video image is displayed with the minimum number $V_{min}$ of vertical lines is set to a period of 10 pulses of the horizontal synchronization signal, and thus in the luminance adjustment unit 60, the light emission luminance $Y_{now}$ of the light emitting elements 32 during one frame period when a video image is displayed with the total number $V_{now}$ of vertical lines in the current frame is adjusted as $Y_{now}=Y_{min}-10/110 \times Y_{min}=Y_{min}-0.091 \times Y_{min}$.

As described above, with the control device 20 according to the present embodiment, even if the total number $V_{now}$ of vertical lines in the current frame is not supplied to the light emission control unit 50 from the outside, if the difference $V_{diff}$ between the minimum number $V_{min}$ of vertical lines and the total number $V_{now}$ of vertical lines in the current frame is supplied, the control device 20 can adjust the light emission luminance $Y_{now}$ of the light emitting elements 32 when a video image is displayed with the total number $V_{now}$ of vertical lines in the current frame.

Embodiment 3

Figure 8:
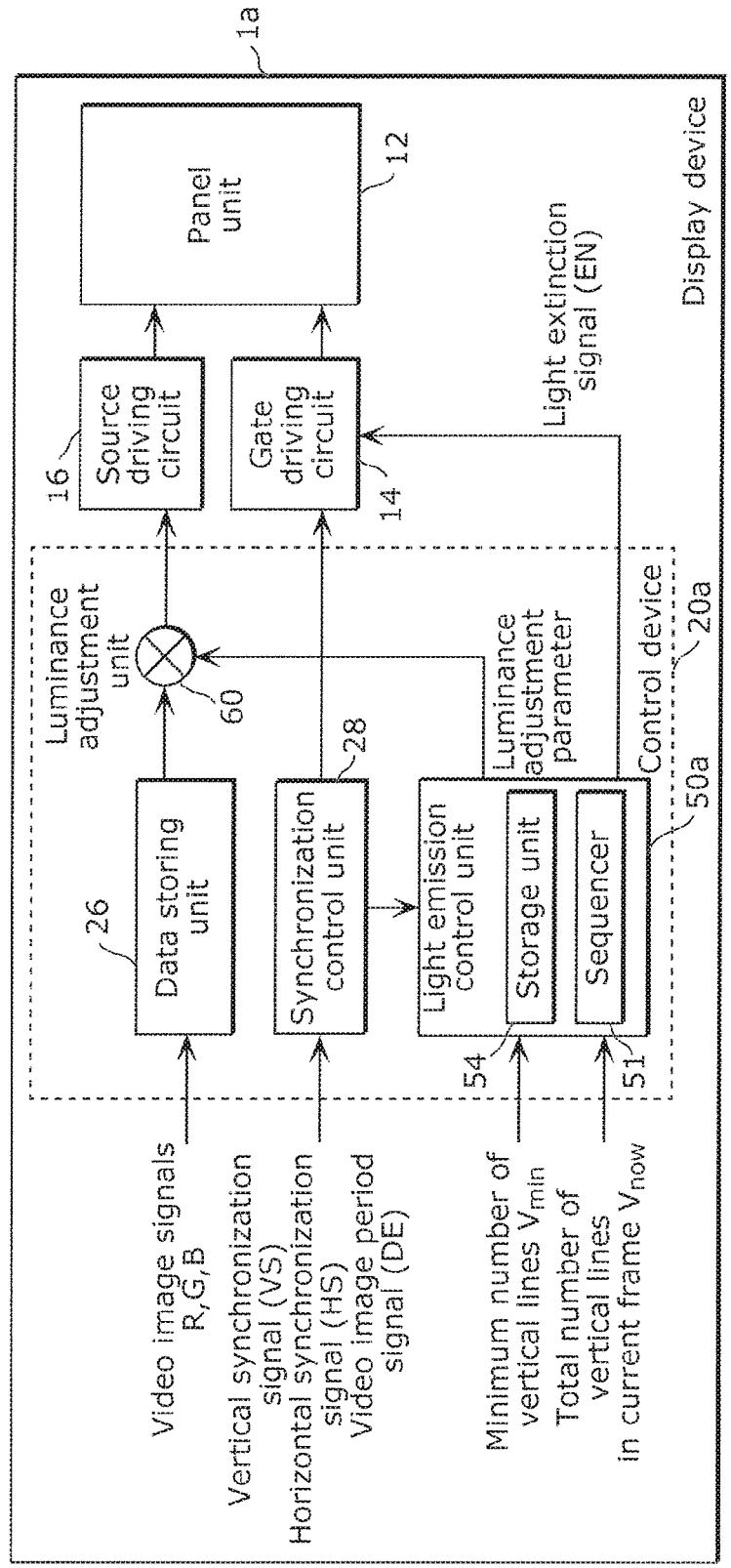
FIG. 8 is a block diagram showing a configuration of a display device according to Embodiment 3.

Next, Embodiment 3 will be described with reference to FIGS. 8 and 9. FIG. 8 is a block diagram showing a configuration of a display device 1a according to the present embodiment. FIG. 9 is a diagram showing an example of a light emission luminance table stored in the display device 1a according to the present embodiment.

The display device 1a according to the present embodiment is different from the display device 1 according to Embodiment 1 in that the light emission control unit included in the control device controls the light emission luminance based on a light emission luminance table in which luminance adjustment parameters are stored in advance.

As shown in FIG. 8, in the display device 1a according to the present embodiment, a control device 20a includes a light emission control unit 50a. The light emission control unit 50a includes a sequencer 51 and a storage unit 54. The sequencer 51 has the same configuration as that of the sequencer 51 according to Embodiment 1, and thus a detailed description thereof is omitted here.

The storage unit 54 is a memory in which control parameters, a control program, and the like for controlling the light emission of the light emitting elements 32 are stored. The storage unit 54 includes a light emission luminance table 70 that is referenced by the light emission control unit 50a when controlling the light emission luminance $Y_{now}$ of the light emitting elements 32 when a video image is displayed with the total number $V_{now}$ of vertical lines in the current frame. As shown in FIG. 9, in the light emission luminance table 70, combinations of the minimum number $V_{min}$ of vertical lines, the total number $V_{now}$ of vertical lines in the current frame, and the difference $V_{diff}$ between the minimum number $V_{min}$ of vertical lines and the total number $V_{now}$ of vertical lines in the current frame are stored. In addition, luminance adjustment parameters calculated in advance for each combination are also stored together with the combinations.

The light emission control unit 50a selects, from the light emission luminance table 70, a luminance adjustment parameter that corresponds to the minimum number $V_{min}$ of vertical lines and the total number $V_{now}$ of vertical lines in the current frame, and outputs the selected luminance adjustment parameter to the luminance adjustment unit 60. The luminance adjustment unit 60 adjusts, by using the luminance adjustment parameter supplied from the light emission control unit 50a, the light emission luminance $Y_{now}$ of the light emitting elements 32 when a video image is displayed with the total number $V_{now}$ of vertical lines in the current frame.

In this way, by selecting an optimal luminance adjustment parameter from among the already calculated luminance adjustment parameters, the control device 20a can easily adjust the light emission luminance $Y_{now}$ of the light emitting elements 32 when a video image is displayed with the total number $V_{now}$ of vertical lines in the current frame.

The light emission control unit 50a may select, from the light emission luminance table 70, a luminance adjustment parameter that corresponds to the minimum number $V_{min}$ of vertical lines and the total number $V_{now}$ of vertical lines in the current frame, or a luminance adjustment parameter that corresponds to the difference $V_{diff}$ between the minimum number $V_{min}$ of vertical lines and the total number $V_{now}$ of vertical lines in the current frame. The light emission control unit 50a may select a luminance adjustment parameter that corresponds to the minimum number $V_{min}$ of vertical lines and the total number $V_{now}$ of vertical lines in the current frame when the total number $V_{now}$ of vertical lines in the current frame is notified from the outside, and may select a luminance adjustment parameter that corresponds to the difference $V_{diff}$ between the minimum number $V_{min}$ of vertical lines and the total number $V_{now}$ of vertical lines in the current frame when the difference $V_{diff}$ between the minimum number $V_{min}$ of vertical lines and the total number $V_{now}$ of vertical lines in the current frame is notified.

In the light emission luminance table 70, it is unnecessary to store all of the four parameters: the minimum number $V_{min}$ of vertical lines, the total number $V_{now}$ of vertical lines in the current frame, the difference $V_{diff}$ between the minimum number $V_{min}$ of vertical lines and the total number $V_{now}$ of vertical lines in the current frame, and the luminance adjustment parameter as shown in FIG. 9. For example, only two parameters: the difference $V_{diff}$ between the minimum number $V_{min}$ of vertical lines and the total number $V_{now}$ of vertical lines in the current frame, and the luminance adjustment parameter may be stored.

Also, the storage unit 54 may have different light emission luminance tables for each value of the minimum number $V_{min}$ of vertical lines, or may have different light emission luminance tables for each value of the difference $V_{diff}$ between the minimum number $V_{min}$ of vertical lines and the total number $V_{now}$ of vertical lines in the current frame.

Also, the light emission luminance parameters of the light emission luminance table 70 may be changed as appropriate.

Also, the light emission control unit 50a may include, instead of the storage unit 54, a luminance computation unit 52, or may include both a luminance computation unit 52 and a storage unit 54. In this case, the light emission control unit 50a may store new luminance adjustment parameters with respect to the minimum number $V_{min}$ of vertical lines and the total number $V_{now}$ of vertical lines in the current frame calculated in the previous light emission luminance adjustment into a light emission luminance table 70, and select a luminance adjustment parameter from the light emission luminance table 70 when light emission luminance adjustment is performed next time.

Variation 1

Figure 10:
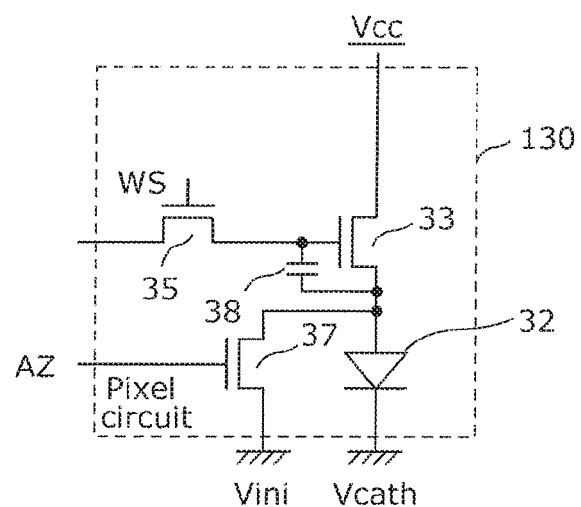
FIG. 10 is a circuit diagram showing a configuration of a pixel circuit according to Variation 1.

Variation 1 of Embodiments 1 to 3 will be described next with reference to FIG. 10. FIG. 10 is a circuit diagram showing a configuration of a pixel circuit 130 according to the present variation. The pixel circuit 130 according to the present variation is different from the pixel circuit 30 according to the embodiment in that the pixel circuit 130 according to the present variation does not include switch transistors 34 and 36.

As shown in FIG. 10, the pixel circuit 130 includes a light emitting element 32, a driving transistor 33, a selection transistor 35, a switch transistor 37, and a pixel capacitor 38. The configurations of the light emitting element 32, the driving transistor 33, the selection transistor 35, the switch transistor 37, and the pixel capacitor 38 are the same as the configurations of the light emitting element 32, the driving transistor 33, the selection transistor 35, the switch transistor 37, and the pixel capacitor 38 of the pixel circuit 30 according to the embodiment.

Here, the pixel circuit 130 does not include a switch transistor 34, and thus the light emission of the light emitting element 32 is performed by the switch transistor 37, rather than the light emission of the light emitting elements 32 being performed collectively by the light extinction signal EN.

At this time, when a control signal AZ is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal AZ to the gate of the switch transistor 37 is stopped, and the switch transistor 37 is turned off, the drain-to-source current of the driving transistor 33 flows through the light emitting element 32. Accordingly, the light emitting element 32 emits light.

Also, because the pixel circuit 130 does not include a switch transistor 36, the initialization operation is performed by the switch transistor 37.

Even with a display panel that includes the pixel circuit 130 configured described above, it is possible to suppress a flicker phenomenon as with the display device 1 according to the embodiment.

Variation 2

Figure 11:
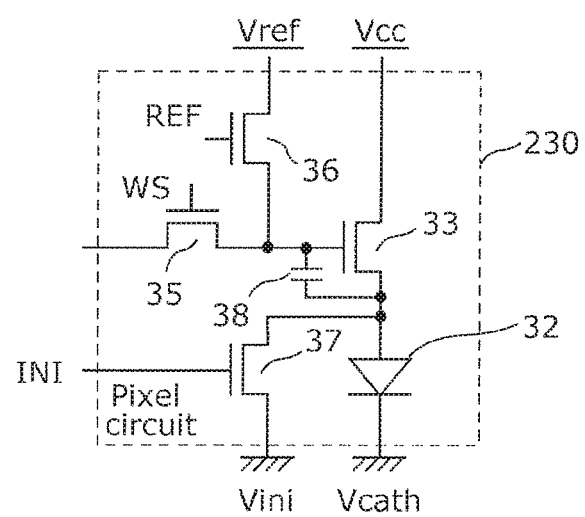
FIG. 11 is a circuit diagram showing a configuration of a pixel circuit according to Variation 2.

Variation 2 of Embodiments 1 to 3 will be described next with reference to FIG. 11. FIG. 11 is a circuit diagram showing a configuration of a pixel circuit 230 according to the present variation. The pixel circuit 230 according to the present variation is different from the pixel circuit 30 according to the embodiment in that the pixel circuit 230 according to the present variation does not include a switch transistor 34.

As shown in FIG. 11, the pixel circuit 230 includes a light emitting element 32, a driving transistor 33, a selection transistor 35, switch transistors 36 and 37, and a pixel capacitor 38. The configurations of the light emitting element 32, the driving transistor 33, the selection transistor 35, the switch transistors 36 and 37, and the pixel capacitor 38 are the same as the configurations of the light emitting element 32, the driving transistor 33, the selection transistor 35, the switch transistors 36 and 37, and the pixel capacitor 38 of the pixel circuit 30 according to Embodiment 1.

Here, the pixel circuit 230 does not include a switch transistor 34, and thus the light emission of the light emitting element 32 is performed by the switch transistor 37, rather than the light emission of the light emitting elements 32 being performed collectively by the light extinction signal EN.

At this time, when a control signal INI is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal INI to the gate of the switch transistor 37 is stopped, and the switch transistor 37 is turned off, the drain-to-source current of the driving transistor 33 flows through the light emitting element 32. Accordingly, the light emitting element 32 emits light.

Even with a display panel that includes the pixel circuit 230 configured described above, it is possible to suppress a flicker phenomenon as with the display device 1 according to Embodiment 1.

Other Embodiments

The present disclosure is not limited to the configurations described in the embodiments and the variations given above, and it is possible to make modifications as appropriate.

For example, the luminance adjustment parameter may be set as the ratio of one frame period when a video image is displayed with the minimum number $V_{min}$ of vertical lines to one frame period when a video image is displayed with the total number $V_{now}$ of vertical lines in the current frame, or may be set as the ratio of the light emission period when a video image is displayed with the minimum number $V_{min}$ of vertical lines to the light emission period when a video image is displayed with the total number $V_{now}$ of vertical lines in the current frame.

Also, the light emission luminance of the light emitting elements may be adjusted by using the minimum number $V_{min}$ of vertical lines and the total number $V_{now}$ of vertical lines in the current frame, or may be adjusted by using the difference $V_{diff}$ between the minimum number $V_{min}$ of vertical lines and the total number $V_{now}$ of vertical lines in the current frame.

Also, the luminance adjustment parameter may be determined through calculation, or may be selected from a light emission luminance table in which calculated light emission luminance values are stored in advance.

Also, in the embodiments and the variations given above, the gate driving circuit may be provided on one of the short sides of the panel unit, or may be provided on each of the opposing short sides of the panel unit. Likewise, the source driving circuit may be provided on one of the long sides of the panel unit, or may be provided on each of the opposing long sides of the panel unit.

Also, the frame period may be started in the control device based on the supply of a vertical synchronization signal VS, or may be based on the timing at which the input of a video image period signal DE is started, or in other words, the timing at which the input of a video image period signal DE that is input after the vertical synchronization signal VS is started.

Also, as described above, the light emission period, or in other words, the frame period may end at a timing at which a number of light emitting elements corresponding to the notified total number of vertical lines have finished emitting light, or a timing at which the vertical synchronization signal VS is input, or a timing at which the input of the video image synchronization signal DE is started.

Also, as described above, the data storing unit may be composed of line buffers, may be composed of other buffers, or may be a storage device, or the like.

Also, the light emitting elements are not limited to organic EL elements, and may be any other light emitting elements such as LEDs. The on-duty ratio of the light emitting elements is not limited to 90%, and may be changed as appropriate.

Also, as the control signal for controlling light emission and light extinction of the light emitting elements, a light extinction signal EN that contains a light extinction instruction may be used, or a light emission signal that contains a light emission instruction may be used according to the characteristics of the transistors. Also, instead of the light extinction signal EN, a control signal AZ or INI may be used.

Also, in the display device, the pixel circuit configuration is not limited to those shown in the embodiments and the variations given above, and may be changed. For example, as long as each pixel circuit is configured to include a driving transistor, a selection transistor, and a pixel capacitor, the arrangement of other switch transistors may be changed as appropriate. Also, a plurality of transistors provided in the pixel circuit may be polysilicon TFTs, or other transistors such as amorphous silicon TFTs. Also, the conductivity type of the transistors may be N channel type or P channel type, or may be a combination thereof.

Figure 12:
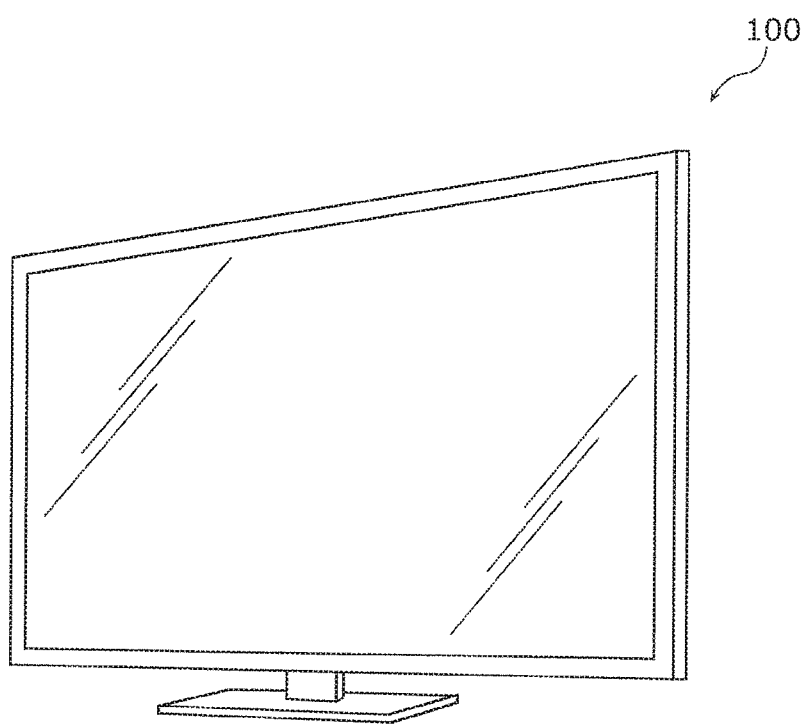
FIG. 12 is an external view of a thin flat television system that is an example of a display device in which the control device according to any one of the embodiments is incorporated.

The present disclosure also encompasses other embodiments obtained by making various modifications that can be conceived by a person having ordinary skill in the art to the above-described embodiments as well as embodiments implemented by any combination of the structural elements and the functions of the above embodiments without departing from the scope of the present disclosure. For example, as examples of the display device that includes the control device according to the present disclosure, a thin flat television system 100 as shown in FIG. 12, a gaming console in which a display panel is incorporated, and a PC monitor system are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful in technical fields such as, in particular, television systems, and displays for gaming consoles and personal computers that are required to provide a display at a high resolution and at a high speed.

The invention claimed is:

1. A display panel control device that controls display of a display panel in which a plurality of pixel circuits that include light emitting elements are arranged in rows and columns, the control device comprising:
   a data storing circuit that temporarily stores a video image signal received from outside;
   a synchronization control circuit that supplies the video image signal from the data storing circuit to the display panel based on a vertical synchronization signal received from the outside or a start timing of the video image signal;
   a light emission control circuit that controls a light emission luminance and a light emission timing of the light emitting elements; and
   a luminance adjustment circuit that adjusts the light emission luminance of the light emitting elements when the video image signal read out from the data storing circuit is displayed,
   wherein
   the light emission control circuit derives a luminance adjustment parameter for adjusting the light emission luminance of the light emitting elements when a video image is displayed with a total number of vertical lines in a current frame,
   the luminance adjustment parameter is derived such that a total light emission amount of the light emitting elements during one frame period, when a video image is displayed with the total number of vertical lines utilized in rendering the current frame, is equal to a total light emission amount of the light emitting elements during one frame period when a video image is displayed with a pre-set minimum number of vertical lines utilized in rendering a frame, and
   the luminance adjustment circuit adjusts, based on the luminance adjustment parameter, the light emission luminance of the light emitting elements when the video image is displayed with the total number of vertical lines utilized in rendering the current frame, such that the light emission luminance of the light emitting elements is different from the total light emission amount of the light emitting elements during the one frame period when the video image is displayed with the pre-set minimum number of vertical lines.

2. The display panel control device according to claim 1, wherein the light emission control circuit calculates, as the luminance adjustment parameter, a ratio of the minimum number of vertical lines to the total number of vertical lines in the current frame, and
   the luminance adjustment circuit adjusts, when the video image is displayed with the total number of vertical lines in the current frame, the light emission luminance of the light emitting elements by performing calculation using the video image signal read out from the data storing circuit and the luminance adjustment parameter.

3. The display panel control device according to claim 2, wherein the luminance adjustment parameter is represented by $V_{min}/V_{now}$, where $V_{min}$ is the minimum number of vertical lines, and $V_{now}$ is the total number of vertical lines in the current frame.

4. The display panel control device according to claim 2, wherein the luminance adjustment parameter is represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

5. The display panel control device according to claim 1, wherein the light emission control circuit includes a storage circuit that stores a plurality of the luminance adjustment parameters calculated in advance based on the minimum number of vertical lines and the total number of vertical lines in the current frame,
   the light emission control circuit selects, from the storage circuit, one of the luminance adjustment parameters that corresponds to the minimum number of vertical lines and the total number of vertical lines in the current frame, and
   the luminance adjustment circuit adjusts, when the video image is displayed with the total number of vertical lines in the current frame, the light emission luminance of the light emitting elements by performing calculation using the video image signal read out from the data storing circuit and the luminance adjustment parameter selected by the light emission control circuit.

6. A display device comprising:
   a panel unit in which a plurality of pixel circuits that include light emitting elements are arranged in rows and columns;
   a source driving circuit that supplies a video image signal to the pixel circuits, the video image signal being a signal that is displayed on the panel unit;

a gate driving circuit that supplies a synchronization signal to the pixel circuits, the synchronization signal being a signal for controlling a display timing of the video image signal that is displayed on the panel unit; and a control device that controls the gate driving circuit and the source driving circuit, the control device including:
  a data storing circuit that temporarily stores the video image signal received from outside;
  a synchronization control circuit that supplies the video image signal from the data storing circuit to the display panel based on a vertical synchronization signal received from the outside or a start timing of the video image signal;
  a light emission control circuit that controls a light emission luminance and a light emission timing of the light emitting elements; and
  a luminance adjustment circuit that adjusts the light emission luminance of the light emitting elements when the video image signal read out from the data storing circuit is displayed, wherein
the light emission control circuit derives a luminance adjustment parameter for adjusting the light emission luminance of the light emitting elements when a video image is displayed with a total number of vertical lines in a current frame,
the luminance adjustment parameter is derived such that a total light emission amount of the light emitting elements during one frame period, when the video image is displayed with the total number of vertical lines utilized in rendering the current frame, is equal to a total light emission amount of the light emitting elements during one frame period when a video image is displayed with a pre-set minimum number of vertical lines utilized in rendering a frame, and
the luminance adjustment circuit adjusts, based on the luminance adjustment parameter, the light emission luminance of the light emitting elements when the video image is displayed with the total number of vertical lines utilized in rendering the current frame, such that the light emission luminance of the light emitting elements is different from the total light emission amount of the light emitting elements during the one frame period when the video image is displayed with the pre-set minimum number of vertical lines.

7. The display device according to claim 6,
wherein the light emission control circuit calculates, as the luminance adjustment parameter, a ratio of the minimum number of vertical lines to the total number of vertical lines in the current frame, and
the luminance adjustment circuit adjusts, when the video image is displayed with the total number of vertical lines in the current frame, the light emission luminance of the light emitting elements by performing calculation using the video image signal read out from the data storing circuit and the luminance adjustment parameter.

8. The display device according to claim 7,
wherein the luminance adjustment parameter is represented by $V_{min}/V_{now}$, where $V_{min}$ is the minimum number of vertical lines, and $V_{now}$ is the total number of vertical lines in the current frame.

9. The display device according to claim 7,
wherein the luminance adjustment parameter is represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

10. The display device according to claim 6,
wherein the light emission control circuit includes a storage circuit that stores a plurality of the luminance adjustment parameters calculated in advance based on the minimum number of vertical lines and the total number of vertical lines in the current frame,
the light emission control circuit selects, from the storage circuit, one of the luminance adjustment parameters that corresponds to the minimum number of vertical lines and the total number of vertical lines in the current frame, and
the luminance adjustment circuit adjusts, when the video image is displayed with the total number of vertical lines in the current frame, the light emission luminance of the light emitting elements by performing calculation using the video image signal read out from the data storing circuit and the luminance adjustment parameter selected by the light emission control circuit.

11. A method for driving a display panel in which a plurality of pixel circuits that include light emitting elements are arranged in rows and columns, the method comprising:
  starting a frame period when a vertical synchronization signal is received or a start timing of a video image signal is detected, the frame period including a video image period and an extended period, the video image period being a period from after start of the frame period to end of supply of the video image signal to the pixel circuits, and the extended period being a period from after end of the video image period to next reception of the vertical synchronization signal or next detection of the start timing of the video image signal;
  deriving, by a light emission control circuit, a luminance adjustment parameter based on a total number of vertical lines utilized in rendering a current frame notified after the reception of the vertical synchronization signal or detection of a start timing of a video image signal, the luminance adjustment parameter being a parameter for adjusting a light emission luminance of the light emitting elements when a video image is displayed with the total number of vertical lines utilized in rendering the current frame;
  initializing the pixel circuits within a predetermined period after the reception of the vertical synchronization signal or the detection of the start timing of the video image signal;
  temporarily storing the video image signal in a data storing circuit after the reception of the vertical synchronization signal or the detection of the start timing of the video image signal;
  adjusting, by a luminance adjustment circuit, the light emission luminance of the light emitting elements by performing calculation using the video image signal read out from the data storing circuit and the luminance adjustment parameter; and
  after the initializing of the pixel circuits and during the video image period, causing the light emitting elements to emit light at the adjusted light emission luminance to display the video image signal, wherein in the deriving of the luminance adjustment parameter, the luminance adjustment parameter is derived such that a total light emission amount of the light emitting elements during one frame period, when the video image is displayed with the total number of vertical lines utilized in rendering a current frame, is equal to a total light emission amount of the light emitting elements during one frame period when a video image is displayed with a pre-set minimum number of vertical lines utilized in rendering a frame, and the luminance adjustment circuit adjusts, based on the luminance adjustment parameter, the light emission luminance of the light emitting elements when the video image is displayed with the total number of vertical lines utilized in rendering the current frame, such that the light emission luminance of the light emitting elements is different from the total light emission amount of the light emitting elements during the one frame period when the video image is displayed with the pre-set minimum number of vertical lines.

12. The method for driving a display panel according to claim 11, wherein in the deriving of the luminance adjustment parameter, a ratio of the minimum number of vertical lines to the total number of vertical lines in the current frame is calculated by the light emission control circuit as the luminance adjustment parameter, and in the adjusting of the light emission luminance, the light emission luminance of the light emitting elements is adjusted by the luminance adjustment circuit performing calculation using the video image signal read out from the data storing circuit and the luminance adjustment parameter when the video image is displayed with the total number of vertical lines in the current frame.

13. The method for driving a display panel according to claim 12, wherein the luminance adjustment parameter is represented by $V_{min}/V_{now}$, where $V_{min}$ is the minimum number of vertical lines, and $V_{now}$ is the total number of vertical lines in the current frame.

14. The method for driving a display panel according to claim 12, wherein the luminance adjustment parameter is represented by $1-V_{diff}/(V_{min}+V_{diff})$, where $V_{min}$ is the minimum number of vertical lines, and $V_{diff}$ is a difference of the total number of vertical lines in the current frame to the minimum number of vertical lines.

15. The method for driving a display panel according to claim 11, wherein in the deriving of the luminance adjustment parameter, the luminance adjustment parameter is selected from a storage circuit that stores a plurality of the luminance adjustment parameters calculated in advance based on the minimum number of vertical lines and the total number of vertical lines in the current frame, and in the adjusting of the light emission luminance, the light emission luminance of the light emitting elements is adjusted by the luminance adjustment circuit performing calculation using the video image signal read out from the data storing circuit and the luminance adjustment parameter selected by the light emission control circuit when the video image is displayed with the total number of vertical lines in the current frame.

* * * * *